US012765204B2

(12) United States Patent
Li et al.

(10) Patent No.: US 12,765,204 B2
(45) Date of Patent: Oct. 13, 2026

(54) DISPLAY PANEL AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Shuo Li, Beijing (CN); Ling Shi, Beijing (CN); Yipeng Chen, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 384 days.

(21) Appl. No.: 18/689,944

(22) PCT Filed: Sep. 20, 2022

(86) PCT No.: PCT/CN2022/120007
§ 371 (c)(1),
(2) Date: Mar. 7, 2024

(87) PCT Pub. No.: WO2024/060031
PCT Pub. Date: Mar. 28, 2024

(65) Prior Publication Data
US 2025/0133925 A1 Apr. 24, 2025

(51) Int. Cl.
*H10K 59/131* (2023.01)
*H10K 59/122* (2023.01)

(52) U.S. Cl.
CPC ....... *H10K 59/1315* (2023.02); *H10K 59/122* (2023.02)

(58) Field of Classification Search
CPC ............. H10K 59/1315; H10K 59/122; H10K 59/131; H10D 86/00; G09G 3/32;
(Continued)

(56) References Cited

U.S. PATENT DOCUMENTS 11,373,599 B1 * 6/2022 Chen .................... H10K 59/131
11,749,192 B2 * 9/2023 Li ........................ G09G 3/3233
345/214
(Continued)

FOREIGN PATENT DOCUMENTS

CN 108933155 A 12/2018
CN 110165084 A 8/2019
(Continued)

*Primary Examiner* — Dao H Nguyen
(74) *Attorney, Agent, or Firm* — The Webb Law Firm

(57) ABSTRACT

A display panel includes a substrate, pixel circuits and anodes. A row of pixel circuits is divided into pixel circuit groups, and a group includes a first pixel circuit and a second pixel circuit. In the same group, a first pixel circuit is symmetrical with a second pixel circuit about a first axis. Each pixel circuit includes and overlapping portion. Overlapping portions of the first and second pixel circuits are a first overlapping portion and second overlapping portion. Along a second direction, a minimum distance between the first and second overlapping portions in the same group is a first distance, where the second direction is a row direction in which the pixel circuits are arranged. Along the second direction, a minimum distance between adjacent first and second overlapping portions belonging to different groups is a second distance, and the first distance is less than the second distance.

20 Claims, 22 Drawing Sheets

(58) Field of Classification Search
CPC ......... G09G 3/3233; G09G 2300/0426; G09G 2300/0819; G09G 2300/0842; G09G 2300/0861
See application file for complete search history.

(56) References Cited

U.S. PATENT DOCUMENTS

| | | | | |
|---|---|---|---|---|
| 12,029,073 | B2 | 7/2024 | Shang et al. | |
| 12,535,692 | B2 * | 1/2026 | Zhu | G02B 30/27 |
| 2022/0285427 | A1 * | 9/2022 | Son | G09G 3/3266 |
| 2024/0365612 | A1 * | 10/2024 | Li | H10K 59/131 |
| 2025/0081739 | A1 * | 3/2025 | Shang | H10K 59/121 |
| 2025/0081765 | A1 * | 3/2025 | Yu | H10K 59/131 |

FOREIGN PATENT DOCUMENTS

| | | | |
|---|---|---|---|
| CN | 107706210 | B | 4/2020 |
| CN | 216054713 | U | 3/2022 |
| CN | 114730795 | A | 7/2022 |
| WO | 2021016947 | A1 | 2/2021 |

* cited by examiner

DISPLAY PANEL AND DISPLAY APPARATUS

CROSS-REFERENCE TO RELATED APPLICATION

This application is the United States national phase of International Patent Application No. PCT/CN2022/120007 filed Sep. 20, 2022, the disclosure of which is hereby incorporated by reference in its entirety.

BACKGROUND OF THE INVENTION

Field of the Invention

The present disclosure relates to the field of display technologies, and in particular, to a display panel and a display apparatus.

Description of Related Art

With the rapid development of display technologies, display apparatuses have gradually spread in people's lives. Among them, the organic light-emitting diode (OLED) is widely used in smart products such as cell phones, televisions, laptops, etc. due to its advantages of self-luminescence, low power consumption, wide viewing angle, fast response speed, high contrast, and flexible display.

SUMMARY OF THE INVENTION

In an aspect, a display panel is provided. The display panel includes a substrate, a plurality of pixel circuits and a plurality of anodes. The plurality of pixel circuits are provided on the substrate. The plurality of pixel circuits include multiple first pixel circuits and multiple second pixel circuits. The plurality of pixel circuits are arranged in multiple rows and multiple columns. A row of pixel circuits is divided into multiple pixel circuit groups, and a pixel circuit group includes a first pixel circuit and a second pixel circuit adjacent to each other. In a same pixel circuit group, a first pixel circuit is symmetrical with a second pixel circuit about a first axis, where the first axis extends along a first direction, and the first direction is a column direction in which the plurality of pixel circuits are arranged. The plurality of anodes are provided on a side of the plurality of pixel circuits away from the substrate.

Each pixel circuit includes an overlapping portion, and the pixel circuit is electrically connected to an anode through the overlapping portion. An overlapping portion of the first pixel circuit is a first overlapping portion, and an overlapping portion of the second pixel circuit is a second overlapping portion. Along a second direction, a minimum distance between the first overlapping portion and the second overlapping portion in the same pixel circuit group is a first distance, where the second direction is a row direction in which the plurality of pixel circuits are arranged. Along the second direction, a minimum distance between a first overlapping portion and a second overlapping portion that belong to different pixel circuit groups and are adjacent is a second distance. The first distance is less than the second distance.

In some embodiments, the display panel further includes a plurality of power supply signal lines. Each power supply signal line extends substantially along the first direction and is connected to pixel circuits. Two power supply signal lines respectively connected to the two pixel circuits in the same pixel circuit group form a first power supply signal line group, and the two power supply signal lines of the first power supply signal line group are symmetrical about the first axis.

The plurality of anodes include first anodes, a first anode includes a main body portion, and a center line of the main body portion of the first anode extending along the first direction substantially coincides with the first axis. An orthographic projection of the main body portion of the first anode on the substrate overlaps with orthographic projections of the two power supply signal lines of the first power supply signal line group on the substrate.

In some embodiments, the orthographic projection of the main body portion of the first anode on the substrate is located between orthographic projections of two edges, away from each other, of the two power supply signal lines of the first power supply signal line group on the substrate.

In some embodiments, the power supply signal line includes first trace segments and second trace segments alternately connected, and along the second direction, a minimum width of a first trace segment is greater than a maximum width of a second trace segment; and along the first direction, the first trace segment is located between overlapping portions of adjacent pixel circuits, and an orthographic projection of the first trace segment on the substrate overlaps with the orthographic projection of the main body portion of the first anode on the substrate; and along the second direction, the first overlapping portion and the second overlapping portion in the same pixel circuit group are located between second trace segments of the two power supply signal lines of the first power supply signal line group.

In some embodiments, the two power supply signal lines of the first power supply signal line group are provided separately from each other, and have a spacing therebetween; alternatively, the two power supply signal lines of the first power supply signal line group are provided as one piece.

In some embodiments, the display panel further includes a plurality of data lines. Each data line extends substantially along the first direction and is connected to pixel circuits; and two data lines respectively connected to a first pixel circuit and a second pixel circuit that belong to different pixel circuit groups and are adjacent form a first data line group, the two data lines of the first data line group are symmetrical about a second axis, and the second axis extends along the first direction.

The plurality of anodes include second anodes, a second anode includes a main body portion, and a center line of the main body portion of the second anode extending along the first direction substantially coincides with the second axis; and an orthographic projection of the main body portion of the second anode on the substrate overlaps with orthographic projections of the two data lines of the first data line group on the substrate.

In some embodiments, along the first direction, a portion of the orthographic projection of the main body portion of the second anode on the substrate overlapping with each of the orthographic projections of the two data lines of the first data line group on the substrate has a substantially same length.

In some embodiments, the display panel further includes a plurality of power supply signal lines. Two power supply signal lines respectively connected to the first pixel circuit and the second pixel circuit that belong to the different pixel circuit groups and are adjacent form a second power supply signal line group, and the two power supply signal lines of the second power supply signal line group are symmetrical about the second axis. The two data lines of the first data line group are located between the two power supply signal lines of the second power supply signal line group; and the orthographic projection of the main body portion of the second anode on the substrate further overlaps with orthographic projections of the two power supply signal lines of the second power supply signal line group on the substrate.

In some embodiments, the orthographic projection of the main body portion of the second anode on the substrate is located between orthographic projections of two edges, away from each other, of the two power supply signal lines of the second power supply signal line group on the substrate.

In some embodiments, the data line includes straight line segments and at least one bent segment alternately connected. The straight line segments extend in the first direction, and an orthographic projection of a straight line segment on the substrate overlaps with the orthographic projection of the main body portion of the second anode on the substrate. Along the first direction, a bent segment is located between main body portions of two adjacent second anodes, and the bent segment is bent in a direction away from the second axis.

In some embodiments, the bent segment includes a first section, a second section and a third section connected in sequence, the first section and the third section are respectively connected to straight line segments on both sides of the bent segment, and the second section is farther from the second axis than the straight line segments.

In some embodiments, the display panel further includes a pixel defining layer. The pixel defining layer is provided on a side of the plurality of anodes away from the substrate. The pixel defining layer is provided with a plurality of first openings, and a first opening is located between bent segments of the two data lines of the first data line group.

In some embodiments, along a direction perpendicular to the substrate and directed from the substrate to the plurality of anodes, the display panel comprises a first gate conductive layer, a second gate conductive layer, a first source-drain conductive layer and a second source-drain conductive layer arranged in sequence. In a case where the display panel further comprises a plurality of power supply signal lines, the plurality of power supply signal lines are located in the second source-drain conductive layer. In a case where the display panel further comprises a plurality of data lines, the plurality of data lines are located in the first source-drain conductive layer.

In some embodiments, the pixel circuit includes an active layer pattern; for the first pixel circuit and the second pixel circuit located in the same pixel circuit group, a minimum distance between an active layer pattern of the first pixel circuit and an active layer pattern of the second pixel circuit is a third distance; for a first pixel circuit and a second pixel circuit that belong to different pixel circuit groups and are adjacent, a minimum distance between an active layer pattern of the first pixel circuit and an active layer pattern of the second pixel circuit is a fourth distance; and the third distance is less than the fourth distance.

In some embodiments, the anodes each include a main body portion and a connecting portion, and the plurality of anodes include multiple red anodes, multiple blue anodes, multiple first green anodes and multiple second green anodes.

Main body portions of the multiple red anodes and main body portions of the multiple blue anodes are alternately arranged in the first direction and the second direction, and a connecting portion of a red anode and a connecting portion of a blue anode are each electrically connected to a respective first pixel circuit.

Main body portions of the multiple first green anodes and main body portions of the multiple second green anodes are alternately arranged in the first direction and the second direction, and a connecting portion of a first green anode and a connecting portion of a second green anode are each electrically connected to a respective second pixel circuit.

The main body portions of the multiple red anodes are alternately arranged with the main body portions of the multiple first green anodes in a first oblique direction, and are alternately arranged with the main body portions of the multiple second green anodes in a second oblique direction; and the main body portions of the multiple blue anodes are alternately arranged with the main body portions of the multiple first green anodes in the second oblique direction, and are alternately arranged with the main body portions of the multiple second green anodes in the first oblique direction. Of the first oblique direction, the second oblique direction, the first direction and the second direction, any two intersect.

In some embodiments, at least part of a main body portion of the red anode and at least part of a main body portion of the blue anode are each located between two first overlapping portions adjacent in the first direction, and the connecting portion of the red anode and the connecting portion of the blue anode extend substantially along the first direction; and/or at least part of a main body portion of the first green anode and at least part of a main body portion of the second green anode are each located between a first overlapping portion and a second overlapping portion that belong to different pixel circuit groups and are adjacent, and the connecting portion of the first green anode and the connecting portion of the blue anode extend substantially along the second direction.

In some embodiments, the display panel further includes a pixel defining layer and a first planarization layer. The pixel defining layer is provided on a side of the plurality of anodes away from the substrate. The pixel defining layer is provided with a plurality of second openings, and at least part region of each anode is exposed by a second opening. The first planarization layer is in contact with surfaces of the plurality of anodes proximate to the substrate. The first planarization layer is provided with overlapping holes, and the connecting portion of the anode is connected to the overlapping portion through an overlapping hole. A minimum distance between an orthographic projection of a boundary of the overlapping hole on the substrate and an orthographic projection of a boundary of the second opening on the substrate is greater than or equal to a first preset value.

In some embodiments, the main body portion of the red anode, the main body portion of the blue anode, the main body portion of the first green anode, and the main body portion of the second green anode are each substantially in a shape of a circle or an ellipse; alternatively, of the main body portion of the red anode and the main body portion of the blue anode, one is substantially in a shape of a rhombus and the other is substantially in a shape of a fan; and the main body portion of the first green anode and the main body portion of the second green anode are each substantially in a shape of a rectangle; alternatively, an outer contour of one of the main body portion of the red anode and the main body portion of the blue anode includes a first curved edge and a second curved edge that are connected at ends, two connection points of the first curved edge and the second curved edge are a first connection point and a second connection point, a connection line between the first connection point and the second connection point is a first line segment, and the first curved edge and the first line segment form a semicircle, and the second curved edge and the first line segment form a semiellipse; the other of the main body portion of the red anode and the main body portion of the blue anode is substantially in a shape of a circle or an ellipse; and the main body portion of the first green anode and the main body portion of the second green anode are each substantially in a shape of a circle or an ellipse.

In some embodiments, in a case where the plurality of anodes includes first anodes, the first anodes include the red anodes and the blue anodes; and in a case where the plurality of anodes includes second anodes, the second anodes include the first green anodes and the second green anodes.

In another aspect, a display apparatus is provided. The display apparatus includes the display panel according to any of the above embodiments.

BRIEF DESCRIPTION OF THE DRAWINGS

In order to describe technical solutions in the present disclosure more clearly, the accompanying drawings to be used in some embodiments of the present disclosure will be introduced briefly; however, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
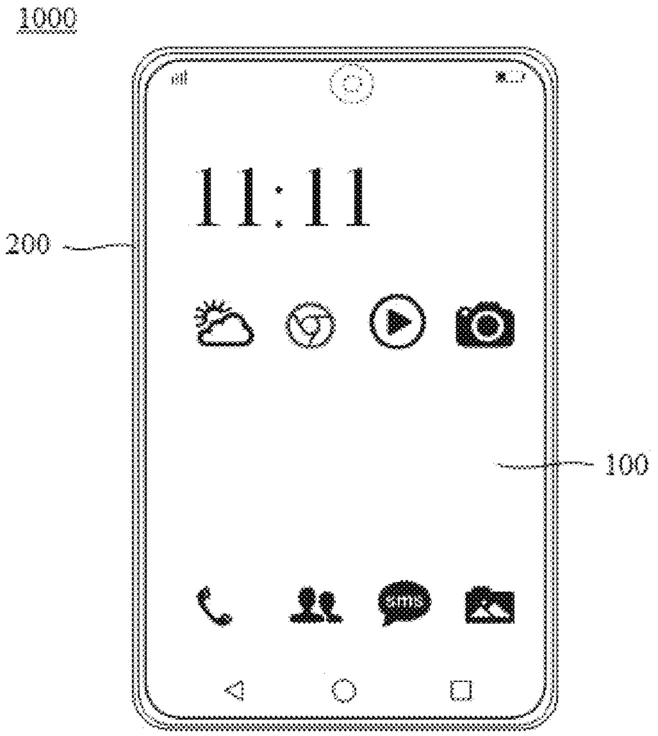
FIG. 1 is a structural diagram of a display apparatus, in accordance with some embodiments.

The technical solutions in some embodiments of the present disclosure will be described clearly and completely with reference to the accompanying drawings; however, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating the number of indicated technical features. Thus, features defined with "first" or "second" may explicitly or implicitly include one or more of the features. In the description of the embodiments of the present disclosure, the term "a plurality of (or multiple)" means two or more unless otherwise specified.

In the description of some embodiments, the terms "connected" and "electrically connected" and their derivatives may be used. For example, the term "connected" may be used in the description of some embodiments to indicate that two or more elements are in direct physical or electrical contact with each other. The embodiments disclosed herein are not necessarily limited to the content herein. As another example, the term "electrically connected" may be used in the description of some embodiments to indicate that two or more components are in direct physical contact or electrical contact with each other. The embodiments disclosed herein are not necessarily limited to the content herein.

The phrase “at least one of A, B, and C” has the same meaning as the phrase “at least one of A, B, or C”, both including the following combinations of A, B, and C: only A, only B, only C, a combination of A and B, a combination of A and C, a combination of B and C, and a combination of A, B, and C.

The phrase “A and/or B” includes the following three combinations: only A, only B, and a combination of A and B.

The use of the phrase “applicable to” or “configured to” herein means an open and inclusive expression, which does not exclude devices that are applicable to or configured to perform additional tasks or steps.

In addition, the use of the phrase “based on” is meant to be open and inclusive, since a process, step, calculation or other action that is “based on” one or more of the stated conditions or values may, in practice, be based on or according to additional conditions or values exceeding those stated.

The term such as “about,” “substantially,” and “approximately” as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as “parallel,” “perpendicular,” or “equal” as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term “parallel” includes absolute parallelism and approximate parallelism, and an acceptable range of deviation of the approximate parallelism may be, for example, a deviation within 5°; the term “perpendicular” includes absolute perpendicularity and approximate perpendicularity, and an acceptable range of deviation of the approximate perpendicularity may also be, for example, a deviation within 5°; and the term “equal” includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Transistors used in pixel circuits provided in embodiments of the present disclosure may be field effect transistors (metal oxide semiconductor, MOS for short) such as thin film transistors (TFT), or other switching devices having the same characteristics, and the embodiments of the present disclosure are described by taking the thin film transistors as an example.

In this text, a control electrode of each thin film transistor used in a pixel driving circuit (pixel circuit) is a gate of the transistor, a first electrode is one of a source and a drain of the thin film transistor, and a second electrode is the other one of the source and the drain of the thin film transistor. Since the source and the drain of the thin film transistor may be symmetrical in structure, there may be no difference in structure between the source and the drain thereof. That is, the first electrode and the second electrode of the thin film transistor in the embodiments of the present disclosure may be indistinguishable in structure. For example, in a case where a thin film transistor is a P-type transistor, a first electrode of the thin film transistor is a source, and a second electrode of the thin film transistor is a drain. For example, in a case where a thin film transistor is an N-type transistor, a first electrode of the transistor is a drain, and a second electrode of the transistor is a source.

In the pixel driving circuit (pixel circuit) provided by the embodiments of the present disclosure, a capacitor may be a capacitor device individually fabricated by a process, for example, by fabricating specialized capacitive electrodes to realize the capacitor device, and the individual capacitive electrodes of the capacitor may be realized by a metal layer, a semiconductor layer (e.g., doped polycrystalline silicon), or the like. Alternatively, the capacitor may be realized by using a parasitic capacitance between transistors, or may be realized by the transistors themselves with other devices and lines, or may be realized by using a parasitic capacitance between the lines of the circuit itself.

As shown in FIG. 1, some embodiments of the present disclosure provide a display apparatus 1000, and the display apparatus 1000 may be any device that can display an image whether in motion (e.g., video) or stationary (e.g., a still image), and whether textual or pictorial. For example, the display apparatus 1000 may be any product or component having a display function, such as a television, a notebook computer, a tablet computer, a mobile phone, a personal digital assistant (PDA), a navigator, a wearable device, or a virtual reality (VR) device.

In some embodiments, referring to FIG. 1, the display apparatus 1000 includes a display panel 100.

Figure 2:
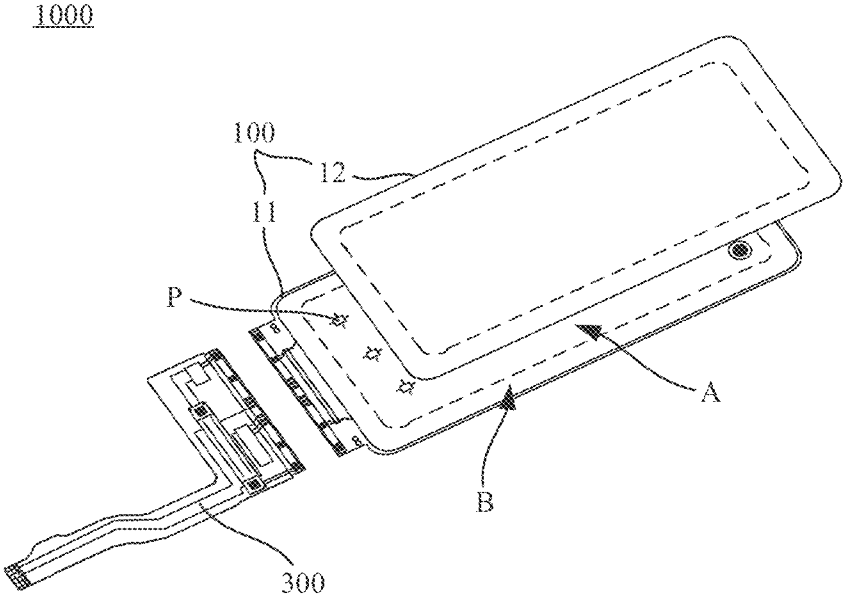
FIG. 2 is an exploded view of a display apparatus, in accordance with some embodiments.

For example, as shown in FIGS. 1 and 2, the display apparatus 1000 may further include a housing 200, a circuit board 300 and other electronic components. The display panel 100 and the circuit board 300 are arranged in the housing 200.

Here, the type of the display panel 100 varies, which may be set according to actual needs.

For example, the display panel 100 may be an organic light-emitting diode (OLED) display panel, a quantum dot light-emitting diode (QLED) display panel, or the like, which is not specifically limited in the present disclosure.

Some embodiments of the present disclosure are schematically described below by considering an example in which the display panel 100 is an OLED display panel.

Figure 3A:
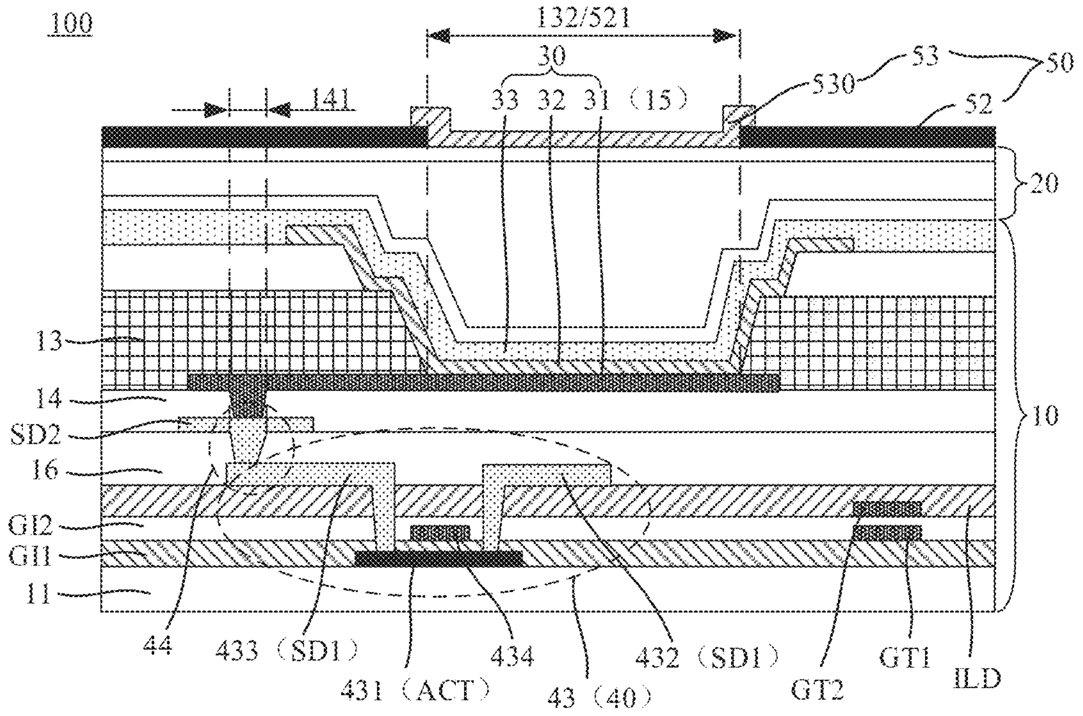
FIG. 3A is a cross-sectional view of a display panel, in accordance with some embodiments.

In some embodiments, referring to FIGS. 2 and 3A, the display panel 100 includes a display substrate 10 and an encapsulation layer 20 for encapsulating the display substrate 10.

Here, as shown in FIGS. 2 and 3A, the display substrate 10 has a light-exit side and a non-light-exit side arranged opposite thereto, and the encapsulation layer 20 is provided on the light-exit side of the display substrate 10, i.e., the upper side in FIG. 3A. The encapsulation layer 20 may be an encapsulation film or an encapsulation substrate.

As shown in FIG. 2, the display panel 10 has a display area A and a peripheral area B provided on at least one side of the display area A. FIG. 2 illustrates an example in which the peripheral area B is provided around the display area A.

Here, the display area A is an area for displaying images, and is configured to allow a plurality of sub-pixels P to be arranged therein; and the peripheral area B is an area where no image is displayed, and is configured to allow display driving circuits to be arranged therein, such as a gate driving circuit and a source driving circuit.

For example, referring to FIGS. 2 and 3A, the display substrate 10 includes a substrate 11 and the plurality of sub-pixels P provided on a side of the substrate 11 and located in the display area A.

The type of the substrate 11 may vary, which may be set according to actual needs.

For example, the substrate 11 may be a rigid substrate. The rigid substrate may be, for example, a glass substrate or a polymethyl methacrylate (PMMA) substrate.

For example, the substrate 11 may be a flexible substrate. The flexible substrate may be, for example, a polyethylene terephthalate (PET) substrate, a polyethylene naphthalate two formic acid glycol ester (PEN) substrate, or a polyimide (PI) substrate.

Here, referring to FIGS. 2 and 3A, the plurality of sub-pixels P may include first sub-pixels for emitting light of a first color, second sub-pixels for emitting light of a second color and third sub-pixels for emitting light of a third color.

The first color, the second color and the third color are three primary colors. For example, the first color is red, the second color is blue and the third color is green. The following will take the first color as red, the second color as blue, and the third color as green as an example to illustrate the embodiments of the present disclosure.

Figure 4:
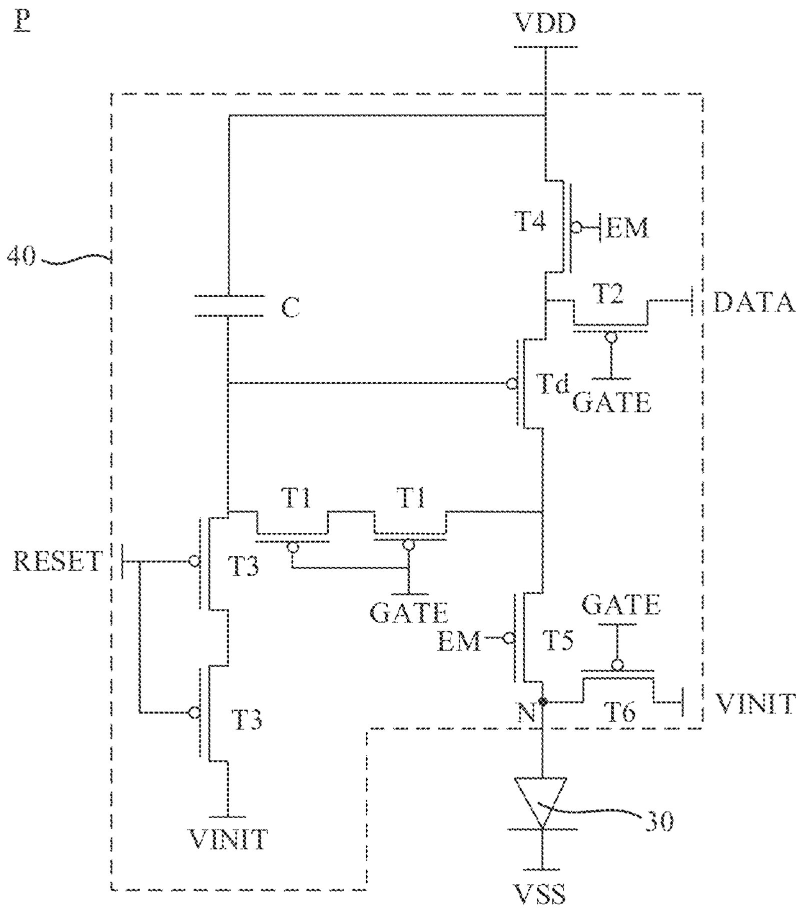
FIG. 4 is a circuit diagram of a pixel circuit, in accordance with some embodiments.

In addition, referring to FIGS. 3A and 4, each sub-pixel P includes a light-emitting device 30 and a pixel circuit 40 that are provided on the substrate 11. The pixel circuit 40 includes multiple thin film transistors 43.

As shown in FIG. 3A, the thin film transistor 43 includes a semiconductor channel 431, a source 432, a drain 433, and a gate 434, in which the source 432 and the drain 433 are both in contact with the semiconductor channel 431.

It will be noted that the above-mentioned source 432 and drain 433 can be interchanged. That is, the reference character of "432" in FIG. 3A represents the drain, and the reference character of "433" in FIG. 3A represents the source.

As shown in FIG. 3A, the light-emitting device 30 includes an anode 31, a light-emitting functional layer 32 and a cathode 33, in which the anode 31 is electrically connected to a source 432 or drain 433 of one of the multiple thin film transistors 43 through an overlapping hole 141. In FIG. 3A, the anode 31 is electrically connected to the drain 433 of the thin film transistor 43 for illustration.

Figure 5:
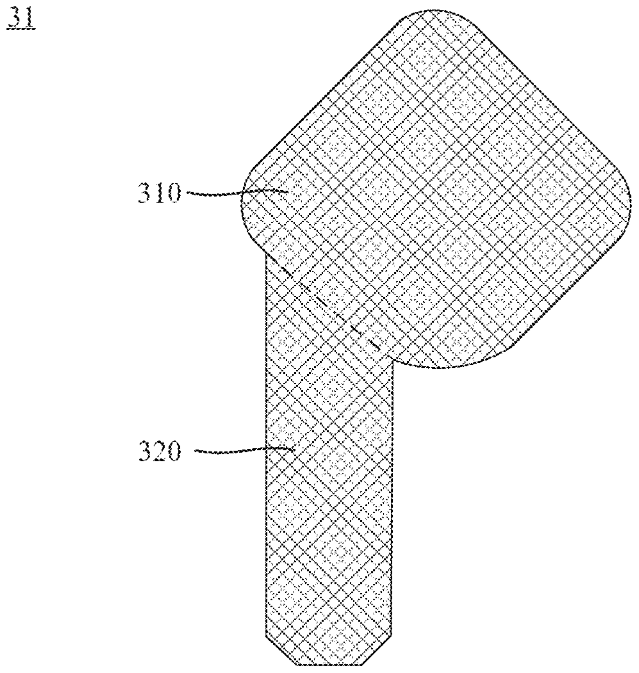
FIG. 5 is a structural diagram of an anode, in accordance with some embodiments.

In some embodiments, referring to FIG. 5, the anode 31 includes a main body portion 310 and a connecting portion 320.

As shown in FIGS. 3A and 5, the main body portion 310 is configured to contact the light-emitting functional layer 32 to form a light-emitting region. That is, an orthographic projection of the light-emitting region on the substrate 11 is located within an orthographic projection of the main body portion 310 on the substrate 11.

As shown in FIGS. 3A and 5, the connecting portion 320 is configured to be electrically connected to the pixel circuit 40. That is, the connecting portion 320 is electrically connected to the source 432 or drain 433 of the thin film transistor 43 through the overlapping hole 141.

In this way, a portion, which forms a light-emitting region, of an anode 31 can be staggered with a portion, which is electrically connected to a pixel circuit 40, of the anode 31, thereby improving the flatness of the portion of the anode 31 forming the light-emitting region, i.e., improving the flatness of the light-emitting device 30.

In some embodiments, referring to FIGS. 2 and 3A, the above-mentioned cathode 33 is a continuous whole-layer pattern and covers the entire display area A.

In some embodiments, referring to FIG. 3A, the light-emitting functional layer 32 includes only a light-emitting layer. In some other embodiments, in addition to the light-emitting layer, the light-emitting functional layer 32 further includes at least one of an electron transport layer (ETL), an electron injection layer (EIL), a hole transport layer (HTL) and a hole injection layer (HIL).

The structure of the pixel circuit 40 may vary, which may be set according to actual needs. For example, the structure of the pixel circuit 40 may be a structure of "2T1C", "3T1C", "6T1C", "7C", "6T2C", or "7T2C", where "T" represents a transistor, a number before "T" represents the number of thin film transistors, "C" represents a storage capacitor, and a number before "C" represents the number of storage capacitors.

Here, during the use of the display panel 100, stabilities of the transistors in the pixel circuit 40 and the light-emitting device 30 may decrease (for example, a threshold voltage of the driving transistor drifts), which affects a display effect of the display panel 100, so that the pixel circuit 40 needs to be compensated.

There are various methods to compensate the pixel circuit 40, which may be set according to actual needs. For example, a pixel compensation circuit may be provided in the pixel circuit 40, so as to use the pixel compensation circuit to perform an internal compensation for the pixel circuit 40. As another example, the driving transistor or the light-emitting device can be sensed through a thin film transistor within the pixel circuit 40, and sensed data may be transmitted to an external sensing circuit, so as to use the external sensing circuit to calculate a driving voltage value that needs to be compensated and give feedback, thereby achieving an external compensation for the pixel circuit 40.

The structure and an operating process of the pixel circuit 40 will be schematically illustrated by taking an example in which an internal compensation method is adopted and the pixel circuit 40 adopts a "7T1C" structure in the present disclosure.

For example, as shown in FIG. 4, the pixel circuit 40 may include a first transistor T1, a second transistor T2, a third transistor T3, a fourth transistor T4, a fifth transistor T5, a sixth transistor T6, a driving transistor Td, and a storage capacitor C.

A control electrode of the first transistor T1 is electrically connected to a scanning signal terminal GATE, a first electrode of the first transistor T1 is electrically connected to a second electrode of the driving transistor Td, and a second electrode of the first transistor T1 is electrically connected to a control electrode of the driving transistor Td.

A control electrode of the second transistor T2 is electrically connected to the scanning signal terminal GATE, a first electrode of the second transistor T2 is electrically connected to a data signal terminal DATA, and a second electrode of the second transistor T2 is electrically connected to a first electrode of the driving transistor Td.

A control electrode of the third transistor T3 is electrically connected to a reset signal terminal RESET, a first electrode of the third transistor T3 is electrically connected to an initialization signal terminal VINIT, and a second electrode of the third transistor T3 is electrically connected to the control electrode of the driving transistor Td.

A control electrode of the fourth transistor T4 is electrically connected to an enable signal terminal EM, a first electrode of the fourth transistor T4 is electrically connected to a first voltage signal terminal VDD, and a second electrode of the fourth transistor T4 is electrically connected to the first electrode of the driving transistor Td.

A control electrode of the fifth transistor T5 is electrically connected to the enable signal terminal EM, a first electrode of the fifth transistor T5 is electrically connected to the second electrode of the driving transistor Td, and a second electrode of the fifth transistor T5 is electrically connected to the anode 31 of the light-emitting device 30 (referring to FIG. 3A).

A control electrode of the sixth transistor T6 is electrically connected to the scanning signal terminal GATE, a first electrode of the sixth transistor T6 is electrically connected to the initialization signal terminal VINIT, and a second electrode of the sixth transistor T6 is electrically connected to the anode 31 of the light-emitting device 30 (referring to FIG. 3A).

A first electrode plate of the storage capacitor C is electrically connected to the control electrode of the driving transistor Td, and a second electrode plate of the storage capacitor C is electrically connected to the first voltage signal terminal VDD.

In the related art, the flatness of the anode of the light-emitting device is low, and the direction of the light emitted by the light-emitting device will deviate, causing problems of color separation and color cast generated in the display apparatus, and the display effect will be reduced.

In light of this, in the display panel 100 provided by some embodiments of the present disclosure, referring to FIG. 3A, the plurality of pixel circuits 40 include multiple first pixel circuits 410 and multiple second pixel circuits 420.

Figure 9:
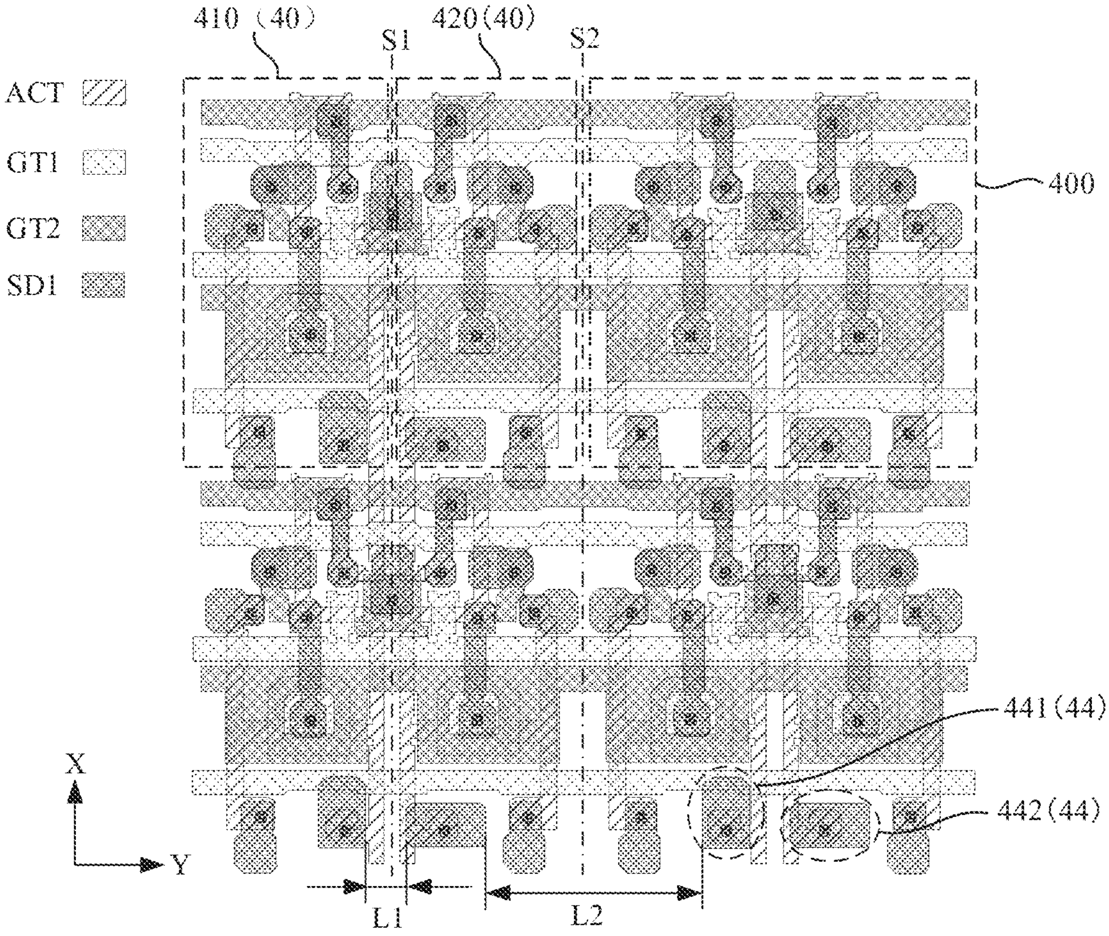
FIG. 9 is a top view of structures in FIG. 8 after a first source-drain conductive layer is added.

As shown in FIG. 9, the plurality of pixel circuits 40 are arranged in multiple rows and multiple columns, and a row of pixel circuits 40 is divided into multiple pixel circuit groups 400. A pixel circuit group 400 includes a first pixel circuit 410 and a second pixel circuit 420 adjacent to each other.

In the same pixel circuit group 400, a first pixel circuit 410 is symmetrical with a second pixel circuit 420 about a first axis S1, where the first axis S1 extends along a first direction X, and the first direction X is a column direction in which the plurality of pixel circuits 40 are arranged.

Figure 10:
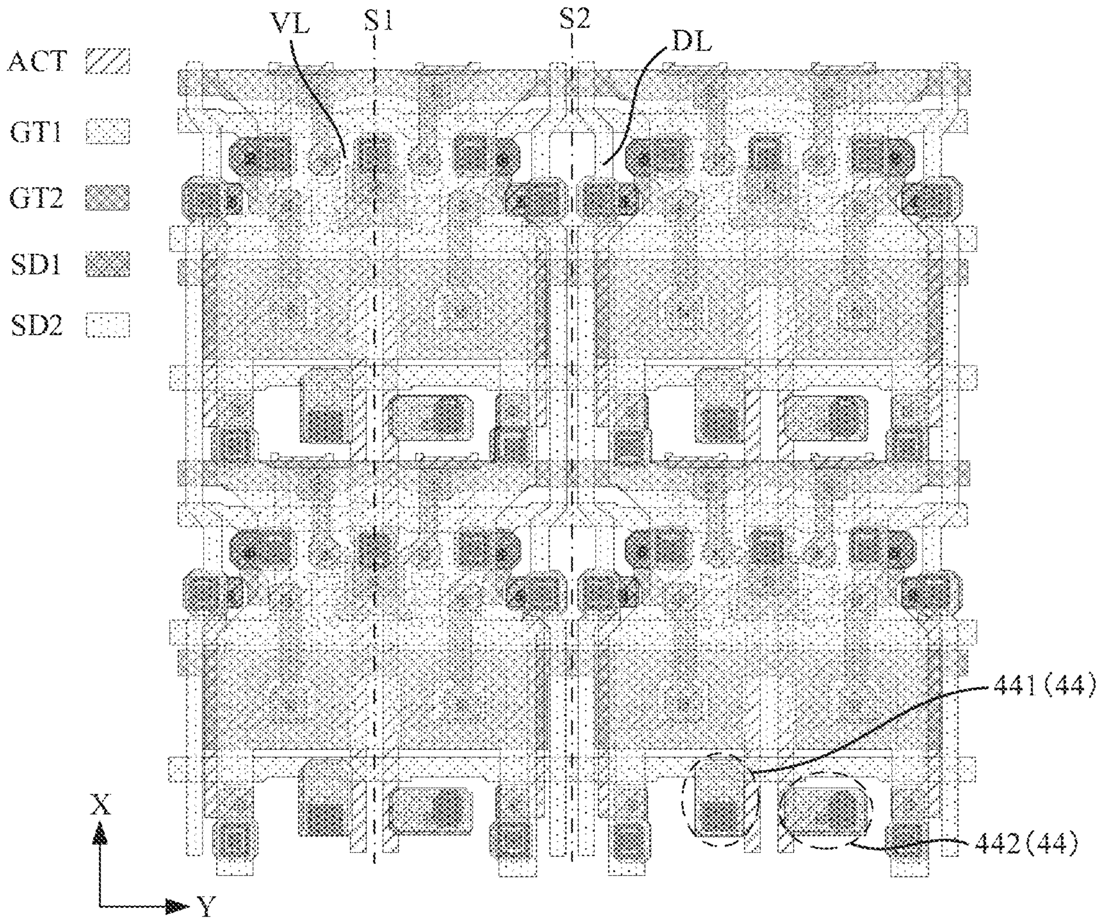
FIG. 10 is a top view of structures in FIG. 9 after a second source-drain conductive layer is added.
Figure 11:
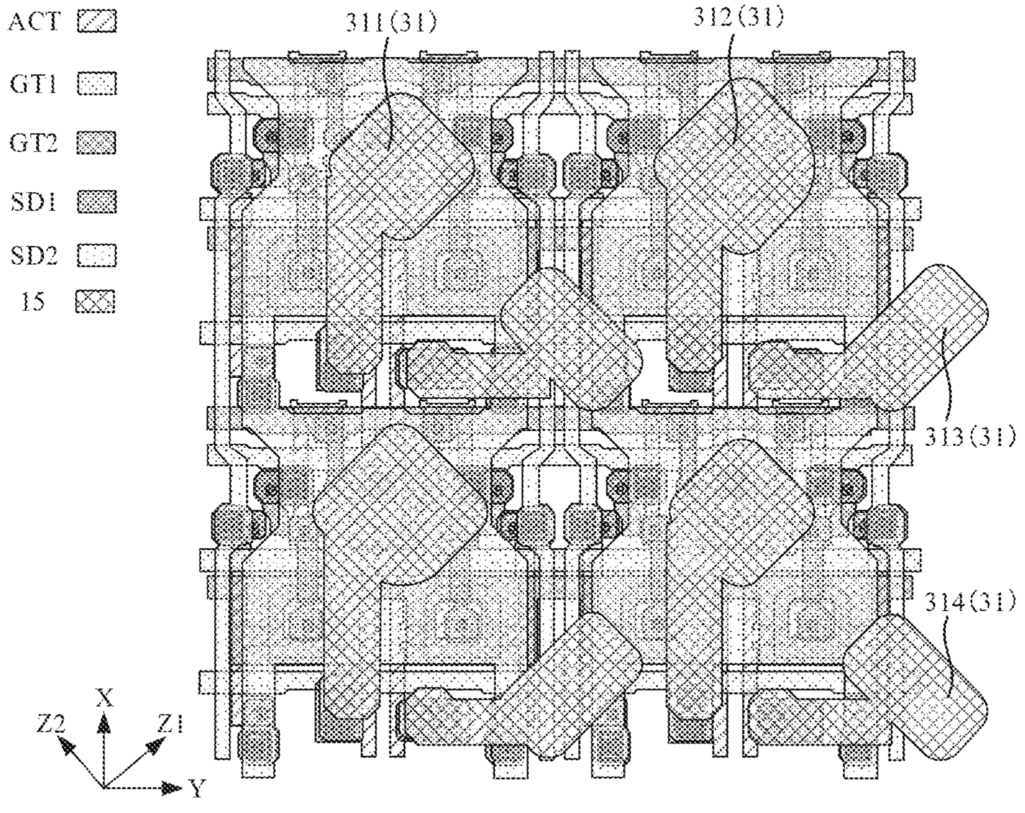
FIG. 11 is a top view of structures in FIG. 10 after an anode layer is added.

On this basis, as shown in FIGS. 9, 10 and 11, each pixel circuit 40 includes an overlapping portion 44, and the pixel circuit 40 is electrically connected to an anode 31 through the overlapping portion 44.

It will be noted that the above-mentioned overlapping portion 44 may include a drain 433 of at least one thin film transistor 43 in the pixel circuit 40 (referring to FIG. 3A). For example, in the above-mentioned pixel circuit 40 of "7T1C", the overlapping portion 44 may be equivalent to a connection node N of the second electrode of the fifth transistor T5 and the second electrode of the sixth transistor T6 in FIG. 4.

Here, an overlapping portion 44 of the first pixel circuit 410 is a first overlapping portion 441, and an overlapping portion 44 of the second pixel circuit 420 is a second overlapping portion 442. Along a second direction Y, a minimum distance between the first overlapping portion 441 and the second overlapping portion 442 in the same pixel circuit group 400 is a first distance L1, where the second direction Y is a row direction in which the plurality of pixel circuits 40 are arranged. Along the second direction Y, a minimum distance between a first overlapping portion 441 and a second overlapping portion 442 that belong to different pixel circuit groups 400 and are adjacent is a second distance L2. The first distance L1 is less than the second distance L2.

It can be seen from the above that in the second direction Y, the minimum distance between the first overlapping portion 441 and the second overlapping portion 442 in the same pixel circuit group 400 is less than the minimum distance between the first overlapping portion 441 and the second overlapping portion 442 that belong to different pixel circuit groups 400 and are adjacent. In this way, in the second direction Y, the distance between the first overlapping portion 441 and the second overlapping portion 442 that belong to different pixel circuit groups 400 and are adjacent is relatively large, so a light-emitting device 30 is capable of being arranged between the first overlapping portion 441 and the second overlapping portion 442 that belong to different pixel circuit groups 400 and are adjacent, and a region where the light-emitting device 30 is capable of being arranged is expanded, which is beneficial to adjusting a position of the light-emitting device 30, so that a minimum distance between the overlapping hole 141 and the light-emitting device 30 is increased, thereby improving the flatness of the light-emitting device 30 and weakening the deviation in the direction of the light emitted by the light-emitting device 30, making the display brightness of the display panel 100 more uniform, and ameliorating the problems of the color separation and color cast generated in the display panel 100 to improve the display effect.

Figure 6:
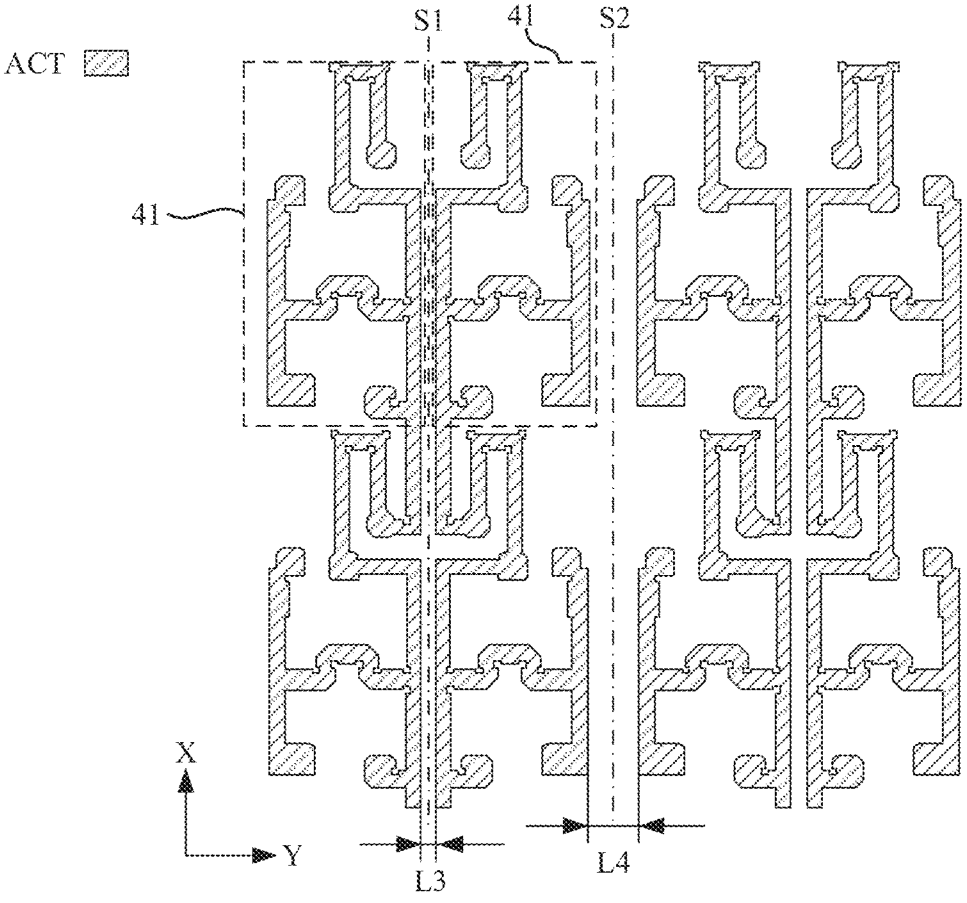
FIG. 6 is a top view of an active layer of a display panel, in accordance with some embodiments.
Figure 7:
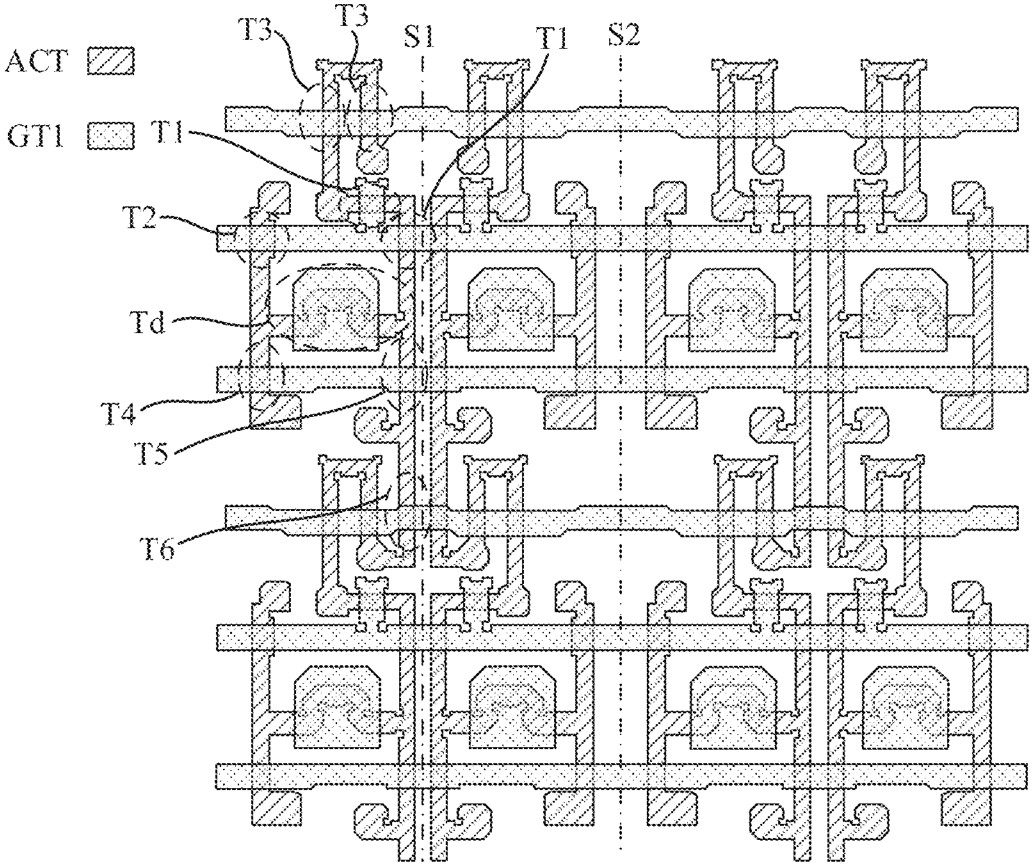
FIG. 7 is a top view of structures in FIG. 6 after a first gate conductive layer is added.
Figure 8:
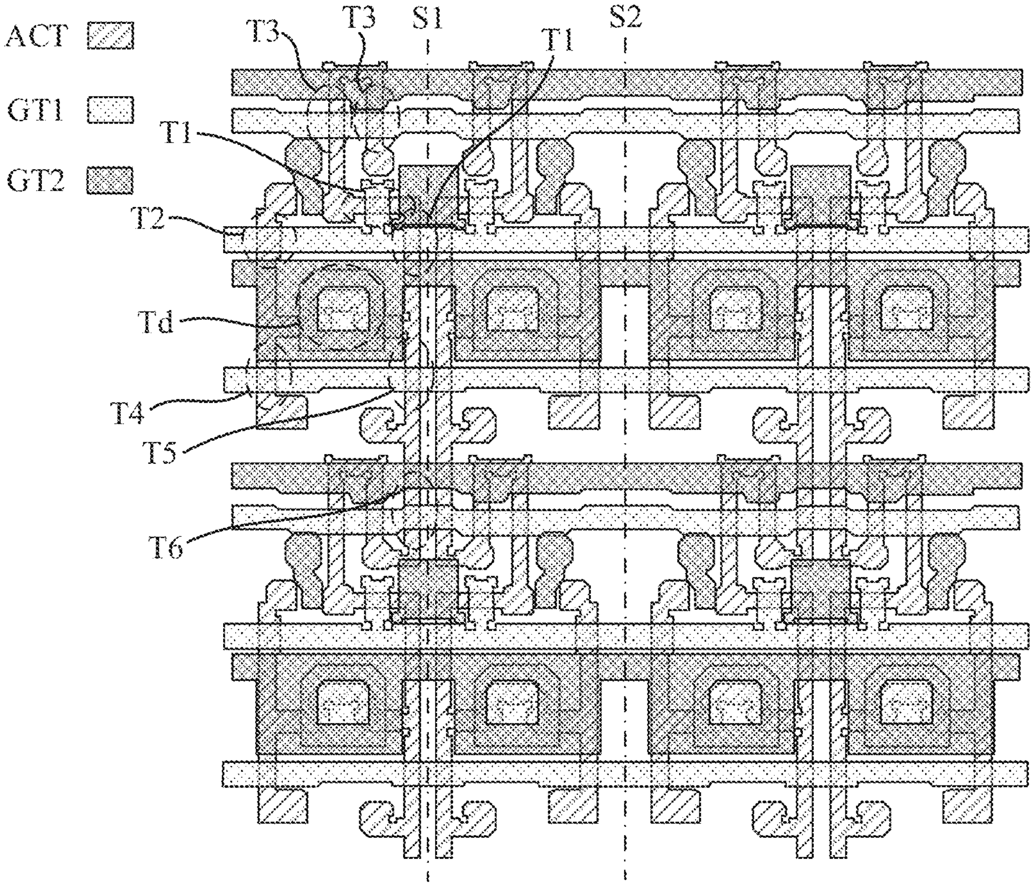
FIG. 8 is a top view of structures in FIG. 7 after a second gate conductive layer is added.

In some embodiments, as shown in FIGS. 6 and 9, each pixel circuit 40 includes an active layer pattern 4. The active layer pattern 41 includes semiconductor channels 431 of the multiple thin film transistors 43 in the pixel circuit 40.

For the first pixel circuit 410 and the second pixel circuit 420 located in the same pixel circuit group 400, a minimum distance between an active layer pattern 41 of the first pixel circuit 410 and an active layer pattern 41 of the second pixel circuit 420 is a third distance L3. For the first pixel circuit 410 and the second pixel circuit 420 that belong to different pixel circuit groups 400 and are adjacent, a minimum distance between an active layer pattern 41 of the first pixel circuit 410 and an active layer pattern 41 of the second pixel circuit 420 is a fourth distance L4. The third distance L3 is less than the fourth distance L4.

In this case, the minimum distance between the first overlapping portion 441 and the second overlapping portion 442 that belong to different pixel circuit groups 400 and are adjacent can be further increased, thereby further enlarging the region where the light-emitting device 30 (referring to FIG. 3A) is capable of being arranged, which is more beneficial to adjusting the position of the light-emitting device 30 (referring to FIG. 3A), so that the minimum distance between the overlapping hole 141 (referring to FIG. 3A) and the light-emitting device 30 (referring to FIG. 3A) is increased.

For example, as shown in FIG. 11, the plurality of anodes 31 include multiple red anodes 311, multiple blue anodes 312, multiple first green anodes 313 and multiple second green anodes 314.

In this text, the red anode 311 refers to an anode 31 corresponding to a sub-pixel P that can emit light with a color of red; the blue anode 312 refers to an anode 31 corresponding to a sub-pixel P that can emit light with a color of blue; the first green anode 313 refers to an anode 31 corresponding to a sub-pixel P that can emit light with a color of green; and the second green anode 314 refers to an anode 31 corresponding to a sub-pixel P that can emit light with a color of green.

For example, the plurality of light-emitting devices 30 include light-emitting device 30 for emitting light with a color of red, light-emitting devices 30 for emitting light with a color of blue, and light-emitting devices 30 for emitting light with a color of green.

In this case, the red anode 311 refers to an anode 31 included in a light-emitting device 30 for emitting light with a color of red; the blue anode 312 refers to an anode 31 included in a light-emitting device 30 for emitting light with a color of blue; the first green anode 313 refers to an anode 31 included in a light-emitting device 30 for emitting light with a color of green; and the second green anode 314 refers to an anode 31 included in a light-emitting device 30 for emitting light with a color of green.

As another example, the light emitted by the light-emitting devices 30 is all white light.

Figure 12:
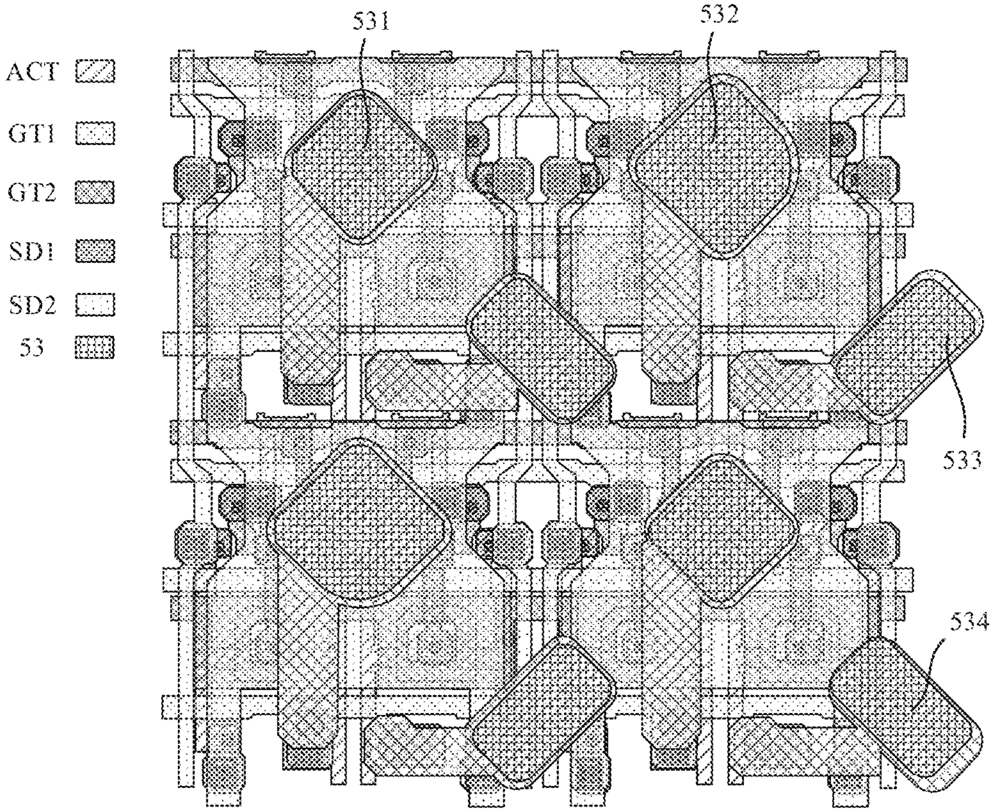
FIG. 12 is a top view of structures in FIG. 11 after a color filter is added.

In this case, referring to FIGS. 3A and 12, the display panel 100 further includes a color filter 53. The color filter 53 may include red light filtering portions 531, blue light filtering portions 532, first green light filtering portions 533, and second green light filtering portions 534. The red anode 311 refers to an anode 31 included in a light-emitting device 30 corresponding to a red light filtering portion 531; the blue anode 312 refers to an anode 31 included in a light-emitting device 30 corresponding to a blue light filtering portion 532; the first green anode 313 refers to an anode 31 included in a light-emitting device 30 corresponding to a first green light filtering portion 533; and the second green anode 314 refers to an anode 31 included in a light-emitting device 30 corresponding to a second green light filtering portion 534.

As shown in FIGS. 5, 9 and 11, main body portions 310 of the multiple red anodes 311 and main body portions 310 of the multiple blue anodes 311 are alternately arranged in the first direction X and the second direction Y, and a connecting portion 320 of a red anode 311 and a connecting portion 320 of a blue anode 312 are each electrically connected to a respective first pixel circuit 410, i.e., to overlap with a respective first overlapping portion 441; and main body portions 310 of the multiple first green anodes 313 and main body portions 310 of the multiple second green anodes 314 are alternately arranged in the first direction X and the second direction Y, and a connecting portion 320 of a first green anode 313 and a connecting portion 320 of a second green anode 314 are each electrically connected to respective a second pixel circuit 420, i.e., to overlap with a respective second overlapping portion 442.

Moreover, the main body portions 310 of the multiple red anodes 311 are alternately arranged with the main body portions 310 of the multiple first green anodes 313 in a first oblique direction Z1, and are alternately arranged with the main body portions 310 of the multiple second green anodes 314 in a second oblique direction Z2; and the main body portions 310 of the multiple blue anodes 312 are alternately arranged with the main body portions 310 of the multiple first green anodes 313 in the second oblique direction Z2, and are alternately arranged with the main body portions 310 of the multiple second green anodes 314 in the first oblique direction Z2.

It will be noted that any two of the first oblique direction Z1, the second oblique direction Z2, the first direction X and the second direction Y intersect.

In this case, a pixel unit includes one light-emitting device 30 for emitting light with a color of red, one light-emitting device 30 for emitting light with a color of blue, and two light-emitting devices 30 for emitting light with a color of green, which may improve the display effect of the display panel 100.

In some examples, as shown in FIGS. 5, 9 and 11, at least part of a main body portion 310 of a red anode 311 and at least part of a main body portion 310 of a blue anode 312 are each located between two first overlapping portions 441 adjacent in the first direction X, and a connecting portion 320 of the red anode 311 and a connecting portion 320 of the blue anode 312 extend substantially along the first direction X.

In some examples, as shown in FIGS. 5, 9 and 11, at least part of a main body portion 310 of a first green anode 313 and at least part of a main body portion 310 of a second green anode 314 are each located between a first overlapping portion 441 and a second overlapping portion 442 that belong to different pixel circuit groups 400 and are adjacent, and a connecting portion 320 of the first green anode 313 and the connecting portion 320 of the blue anode 312 extend substantially along the second direction Y.

That is to say, in the first direction X, a main body portion 310 of a red anode 311 or a main body portion 310 of a blue anode 312 may be arranged between two first overlapping portions 441 adjacent in the same pixel circuit group 400; and in the second direction Y, a main body portion 310 of a first green anode 313 or a main body portion 310 of a second green anode 314 may be arranged between a first overlapping portion 441 and a second overlapping portion 442 that belong to different pixel circuit groups 400 and are adjacent. With this arrangement, a minimum distance between each light-emitting device 30 (referring to FIG. 3A) and an overlapping hole 141 (referring to FIG. 3A) may be increased.

For example, as shown in FIG. 3A, the above-mentioned display panel 100 further includes a pixel defining layer 13 and a first planarization layer 14. The pixel defining layer 13 is provided on a side of the plurality of anodes 31 away from the substrate 11.

Figure 17:
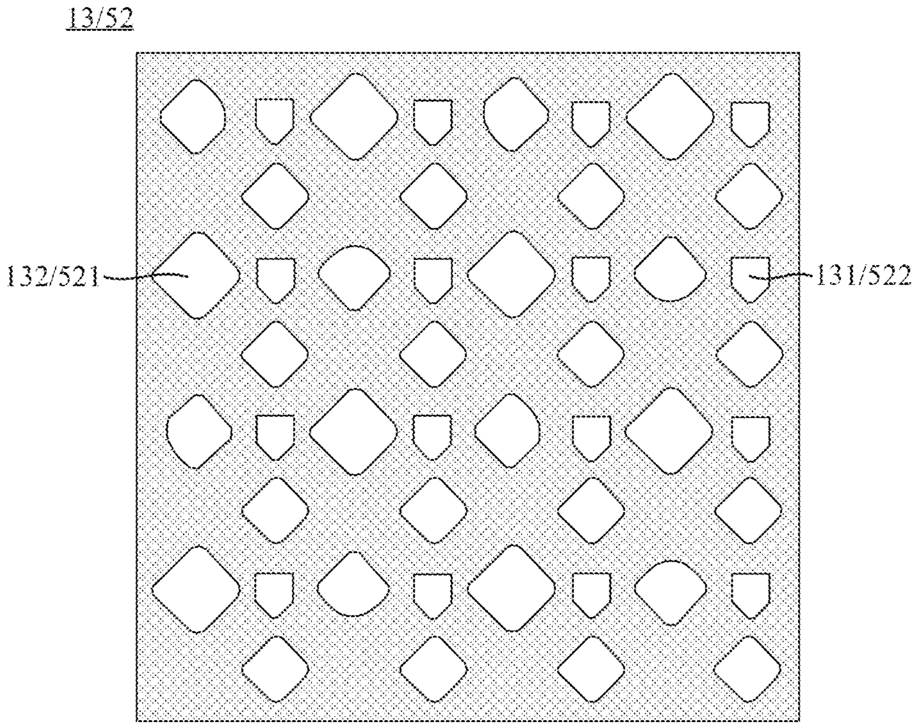
FIG. 17 is a top view of a pixel defining layer or black matrix, in accordance with some embodiments.

Referring to FIGS. 3A and 17, the pixel defining layer 13 has a plurality of second openings 132, and a light-emitting device 30 is provided in a second opening 132. That is, a light-emitting functional layer 32 of the light-emitting device 30 is in electrical contact with an anode in the second opening 132.

It will be noted that in order to reduce process difficulty, an area of a main body portion 310 of the anode 31 is greater than an area of the second opening 132 of the pixel defining layer 13, so that the entire second opening 132 of the pixel defining layer 13 serves as a light-emitting region. That is, an overlapping part of the anode 31, the cathode 33, and the light-emitting functional layer 32 constitute the light-emitting region.

Here, the shape of the main body portion 310 of the anode 31 and the shape of the second opening 132 of the pixel defining layer 13 may be substantially the same or different, which are not specifically limited in the embodiments of the present disclosure.

As shown in FIGS. 3A, 10 and 11, the first planarization layer 14 is in contact with surfaces of the plurality of anodes 31 proximate to the substrate 11. The first planarization layer 14 is provided with overlapping holes 141, and a connecting portion 320 (referring to FIG. 5) of an anode 31 is connected to an overlapping portion 44 through an overlapping hole 141.

It will be noted that an orthographic projection of the overlapping hole 141 on the substrate 11 at least partially overlaps with an orthographic projection of the overlapping portion 44 on the substrate 11. For example, the orthographic projection of the overlapping hole 141 on the substrate 11 is located within the orthographic projection of the overlapping portion 44 on the substrate 11 to increase the connection area of the connecting portion 320 and the overlapping portion 44, improve the reliability of the connection between the connecting portion 320 and the overlapping portion 44, and reduce the resistance.

Here, a minimum distance between an orthographic projection of a boundary of the overlapping hole 141 on the substrate 11 and an orthographic projection of a boundary of the second opening 132 on the substrate 11 is greater than or equal to a first preset value.

It will be noted that the first preset value may range from 8.5 μm to 11.5 μm. For example, the first preset value is any one of 8.5 μm, 9 μm, 9.5 μm, 10 μm, 10.5 μm, 11 μm, and 11.5 μm.

Here, the minimum distance between the orthographic projection of the boundary of the overlapping hole 141 on the substrate 11 and the orthographic projection of the boundary of the second opening 132 on the substrate 11 is greater than or equal to the first preset value, so that a portion of the main body portion 310 of the anode 31 exposed by the second opening 132 has a high flatness. That is, the light-emitting device 30 has a high flatness, thereby weakening the deviation in the direction of the light emitted by the light-emitting device 30, making the display brightness of the display panel 100 more uniform, ameliorating the problems of color separation and color cast generated in the display panel 100, and enhancing the display effect.

It can be understood that the shapes of the main body portion 310 of the red anode 311, the main body portion 310 of the blue anode 312, the main body portion 310 of the first green anode 313 and the second green anode 314 are each not invariable.

Figure 14A:
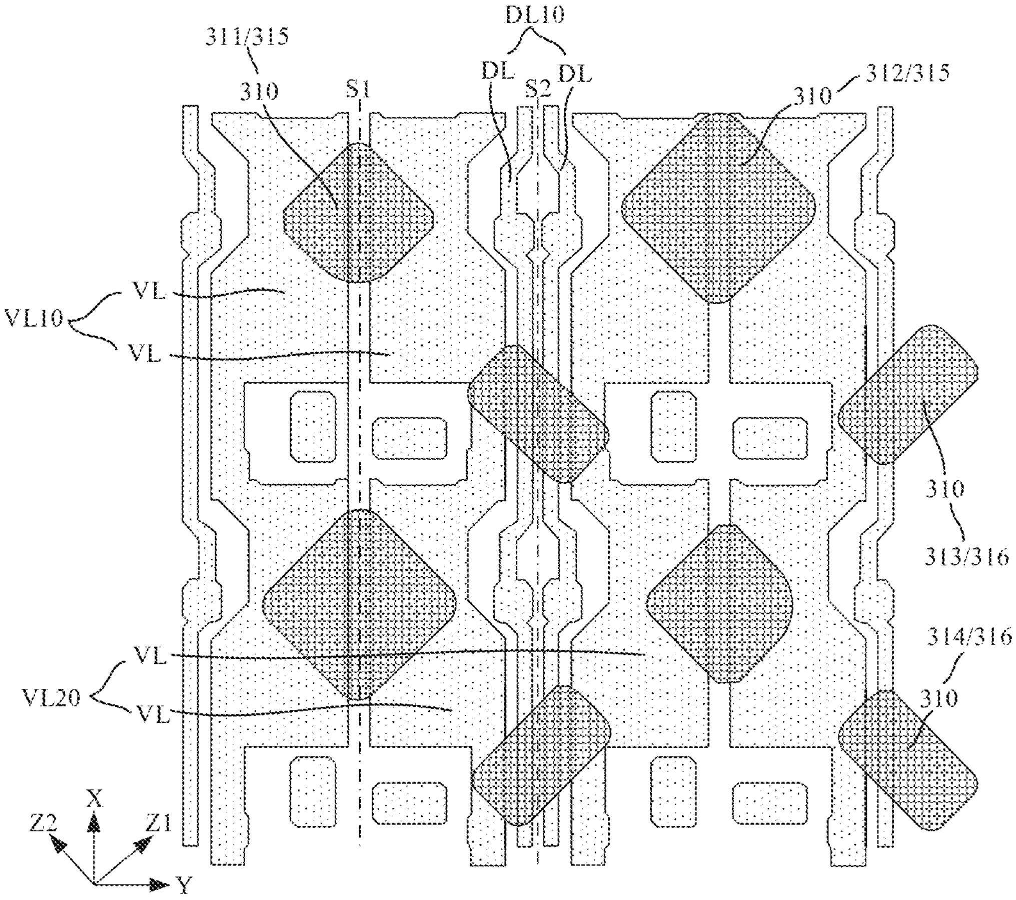
FIG. 14A is a top view of the power supply signal line and data line shown in FIG. 13A stacked with an anode.
Figure 14B:
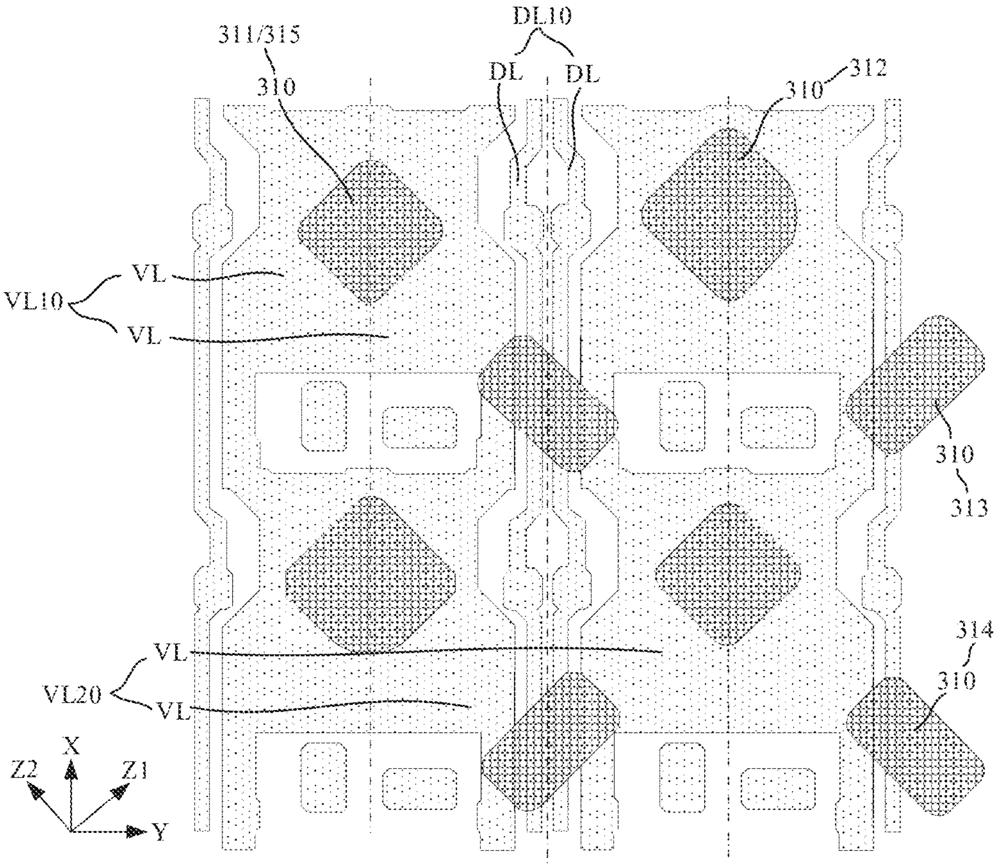
FIG. 14B is a top view of the power supply signal line and data line shown in FIG. 13B stacked with another anode.

In some examples, as shown in FIGS. 14A and 14B, of the main body portion 310 of the red anode 311 and the main body portion 310 of the blue anode 312, one is substantially in a shape of a rhombus and the other is substantially in a shape of a fan; and the main body portion 310 of the first green anode 313 and the main body portion 310 of the second green anode 314 are each substantially in a shape of a rectangle.

The term "substantially in a shape of a rhombus" herein means that a structure is in a shape of a rhombus as a whole, but is not limited to a standard rhombus. That is, "rhombus" here includes not only a standard rhombus but also a shape similar to a rhombus in consideration of process conditions. For example, a rhombus with corners that are curved, that is, the corners are smooth.

The term "substantially in a shape of a fan" herein means that a structure is in a shape of a fan as a whole, but is not limited to a standard fan. That is, "fan" here includes not only a standard fan but also a shape similar to a fan in consideration of process conditions. For example, a fan with an arc-shaped edge whose part is a straight line segment.

The term "substantially in a shape of a rectangle" herein means that a structure is in a shape of a rectangle as a whole, but is not limited to a standard rectangle. That is, "rectangle" here includes not only a standard rectangle but also a shape similar to a rectangle in consideration of process conditions. For example, a rectangle with corners that are curved, that is, the corners are smooth.

For example, as shown in FIG. 14A, the main body portion 310 of the red anode 311 is substantially in a shape of a rhombus, the main body portion 310 of the blue anode 312 is substantially in a shape of a fan, and the main body portion 310 of the first green anode 313 and the main body portion 310 of the second green anode 314 are each substantially in a shape of a rectangle.

As another example, as shown in FIG. 14B, the main body portion 310 of the red anode 311 is substantially in a shape of a fan, the main body portion 310 of the blue anode 312 is substantially in a shape of a rhombus, and the main body portion 310 of the first green anode 313 and the main body portion 310 of the second green anode 314 are each substantially in a shape of a rectangle.

Figure 15:
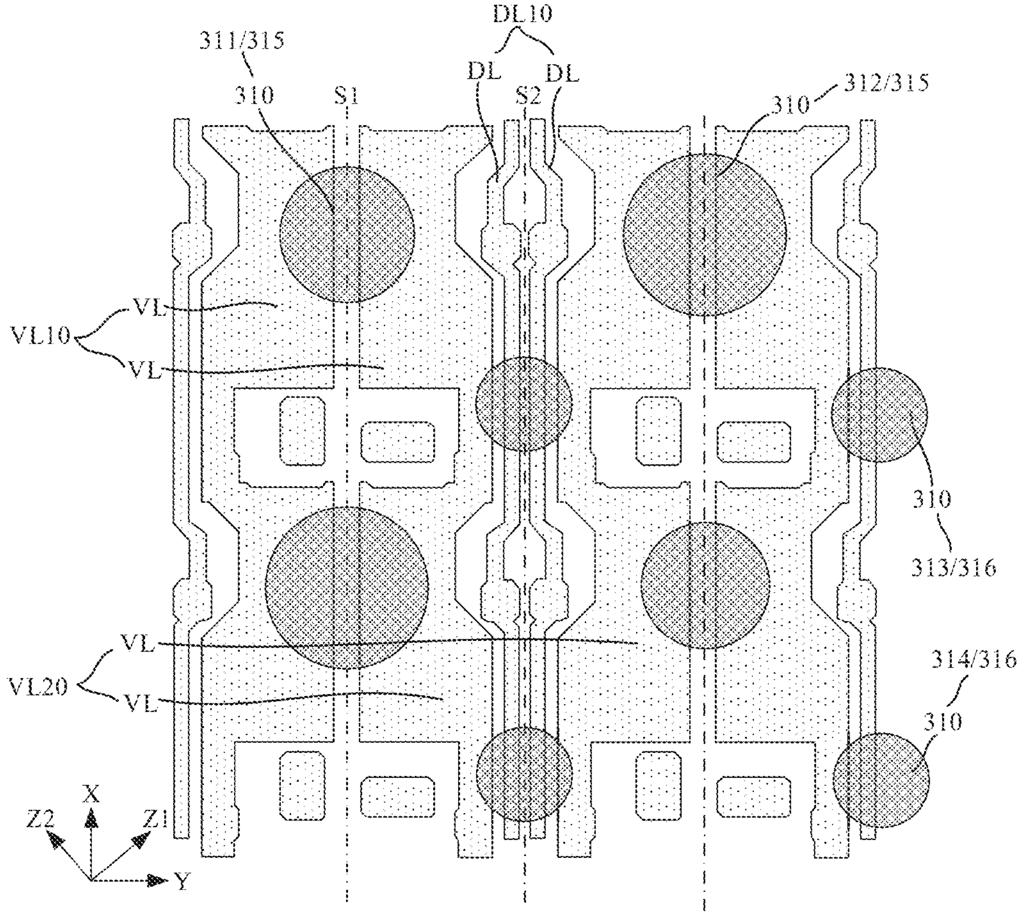
FIG. 15 is a top view of a power supply signal line and data line stacked with yet another anode, in accordance with some embodiments.

In some other examples, as shown in FIG. 15, the main body portion 310 of the red anode 311, the main body portion 310 of the blue anode 312, the main body portion 310 of the first green anode 313, and the main body portion 310 of the second green anode 314 are each substantially in a shape of a circle or an ellipse.

The term "substantially in a shape of a circle or an ellipse" herein means that a structure is in a shape of a circle or an ellipse as a whole, but is not limited to a standard circle or an ellipse. That is, "circle or ellipse" here includes not only a standard circle or ellipse but also a shape similar to a circle or an ellipse in consideration of process conditions. For example, a circle or an ellipse with a local segment that is a straight line.

Figure 16A:
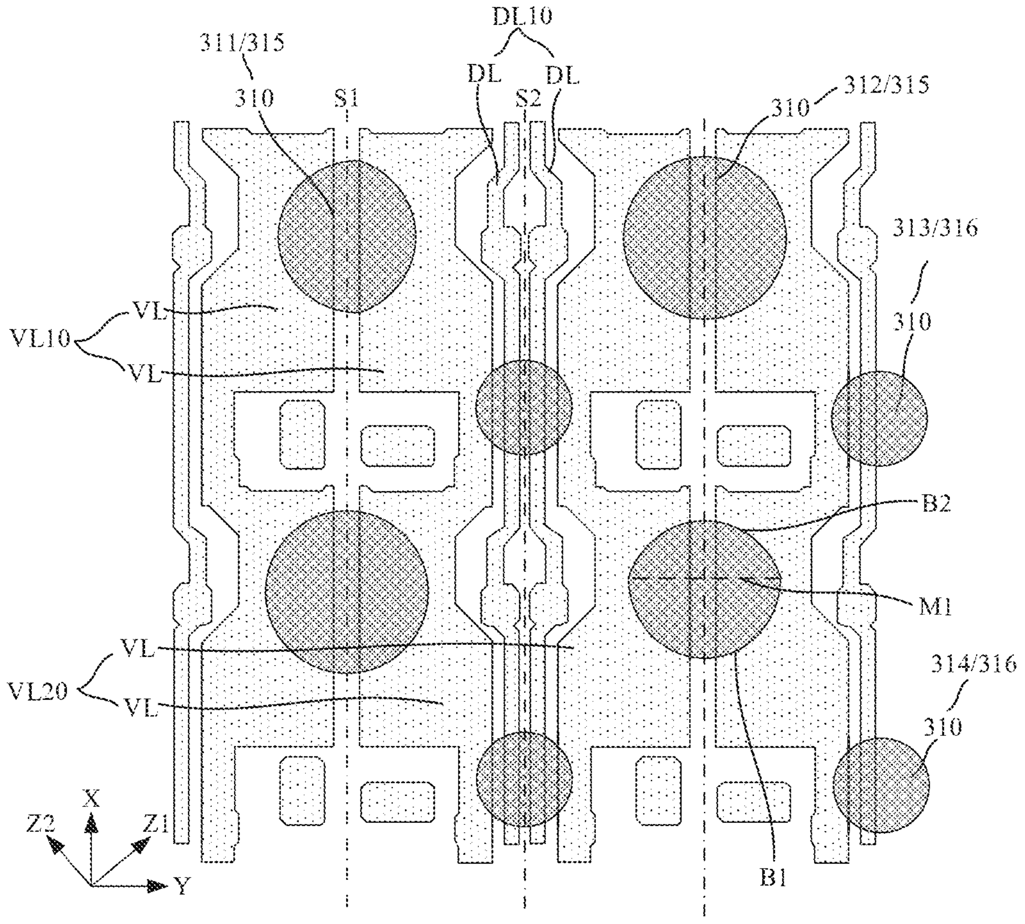
FIG. 16A is a top view of a power supply signal line and data line stacked with yet another anode, in accordance with some embodiments.
Figure 16B:
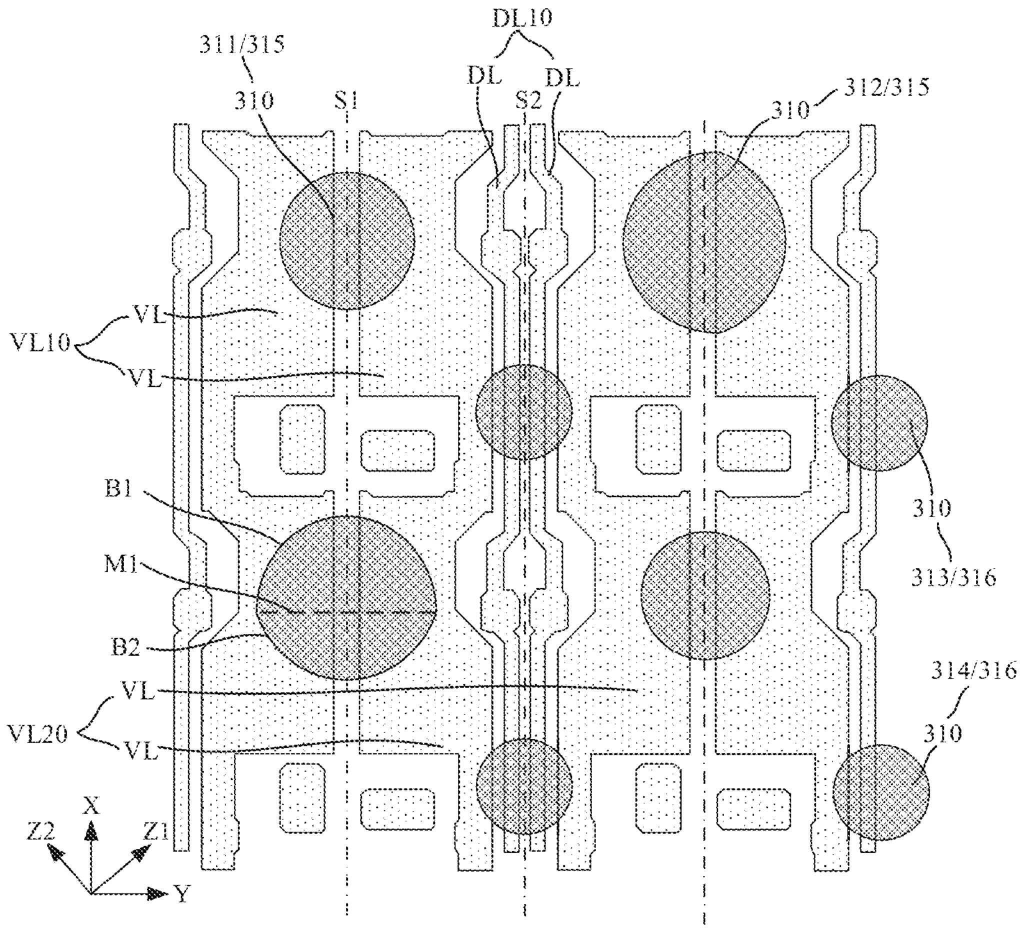
FIG. 16B is a top view of a power supply signal line and data line stacked with yet another anode, in accordance with some embodiments.

In some other examples, as shown in FIGS. 16A and 16B, an outer contour of one of the main body portion 310 of the red anode 311 and the main body portion 310 of the blue anode 312 includes a first curved edge B1 and a second curved edge B2 that are connected at ends, and two connection points of the first curved edge B1 and the second curved edge B2 are a first connection point and a second connection point.

Here, a connection line between the first connection point and the second connection point is a first line segment M1, and the first curved edge B1 and the first line segment M1 form a semicircle, and the second curved edge B2 and the first line segment M1 form a semiellipse. The other of the main body portion 310 of the red anode 311 and the main body portion 310 of the blue anode 312 is substantially in a shape of a circle or an ellipse. The main body portion 310 of the first green anode 313 and the main body portion 310 of the second green anode 314 are each substantially in a shape of a circle or an ellipse.

For example, as shown in FIG. 16A, an outer contour of the main body portion 310 of the red anode 311 includes the first curved edge B1 and the second curved edge B2 that are connected at ends, the first curved edge B1 and the first line segment M1 form a semicircle, and the second curved edge B2 and the first line segment M1 form a semiellipse. The main body portion 310 of the blue anode 312 is substantially in a shape of a circle or an ellipse. The main body portion 310 of the first green anode 313 and the main body portion 310 of the second green anode 314 are each substantially in a shape of a circle or an ellipse.

As another example, as shown in FIG. 16B, the main body portion 310 of the red anode 311 is substantially in a shape of a circle or an ellipse. An outer contour of the main body portion 310 of the blue anode 312 includes the first curved edge B1 and the second curved edge B2 that are connected at ends, the first curved edge B1 and the first line segment M1 form a semicircle, and the second curved edge B2 and the first line segment M1 form a semiellipse. The main body portion 310 of the first green anode 313 and the main body portion 310 of the second green anode 314 are each substantially in a shape of a circle or an ellipse.

Figure 13A:
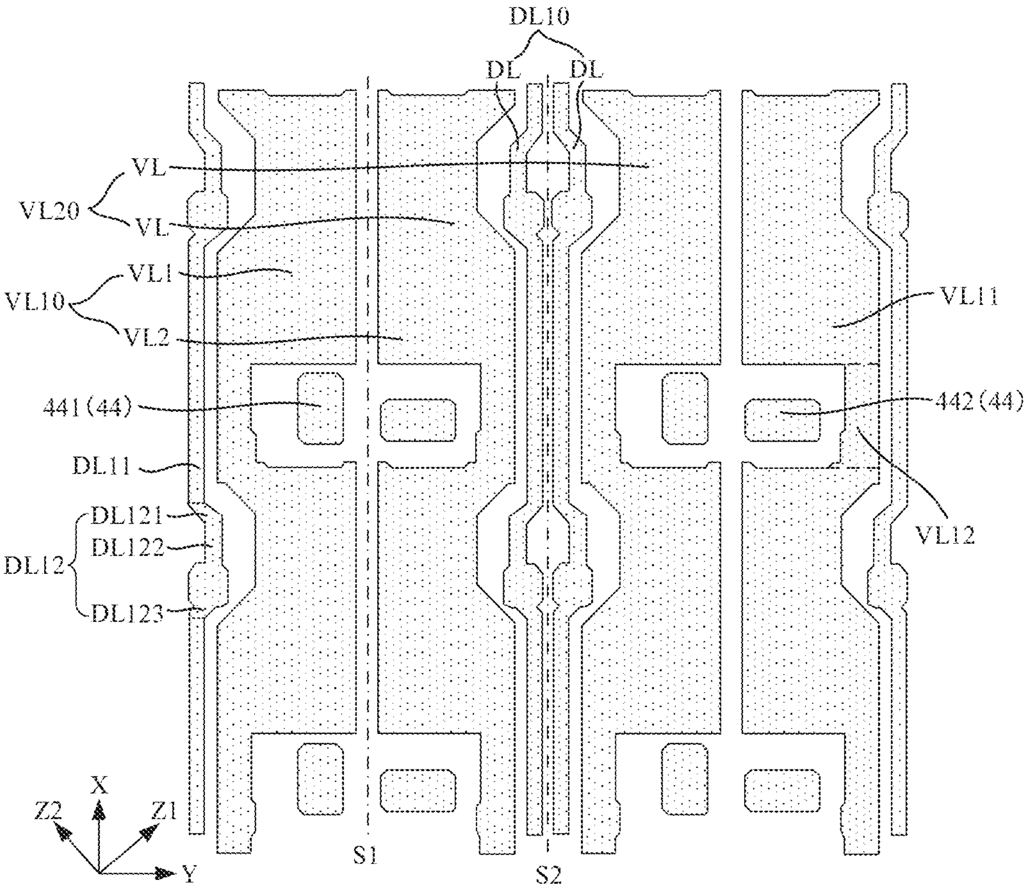
FIG. 13A is a structural diagram of a power supply signal line and a data line, in accordance with some embodiments.

In some embodiments, referring to FIGS. 3A, 4 and 13A, the display panel 100 further includes a plurality of power supply signal lines VL extending substantially along the first direction X, and each power supply signal line VL is connected to pixel circuits 40. For example, each power supply signal line VL is connected to first voltage signal terminals VDD of the pixel circuits 40, and is configured to transmit a first power voltage signal Vdd.

As shown in FIGS. 9, 10 and 13A, among the plurality of power supply signal lines VL, two power supply signal lines VL respectively connected to the two pixel circuits 40 in the same pixel circuit group 400 form a first power supply signal line group VL10, and the two power supply signal lines VL of the first power supply signal line group VL10 are symmetrical about the first axis S1, so as to improve the orderliness of the circuit wiring arrangement and facilitate the connection between a power supply signal line VL and a pixel circuit 40 corresponding thereto.

In some examples, as shown in FIGS. 9 and 13A, the two power supply signal lines VL of the first power supply signal line group VL10 are provided separately from each other, and the two power supply signal lines VL of the first power supply signal line group VL10 have a spacing therebetween. For example, the two power supply signal lines VL of the first power supply signal line group VL10 may include a first power supply signal line VL1 and a second power supply signal line VL2. The first power supply signal line VL1 is located on a side of a first pixel circuit 410 away from the substrate 11 and is electrically connected to the first pixel circuit 410. The second power supply signal line VL2 is located on a side of a second pixel circuit 420 away from the substrate 11 and is electrically connected to the second pixel circuit 420. With this arrangement, interference between different pixel circuits 40 may be reduced.

Figure 13B:
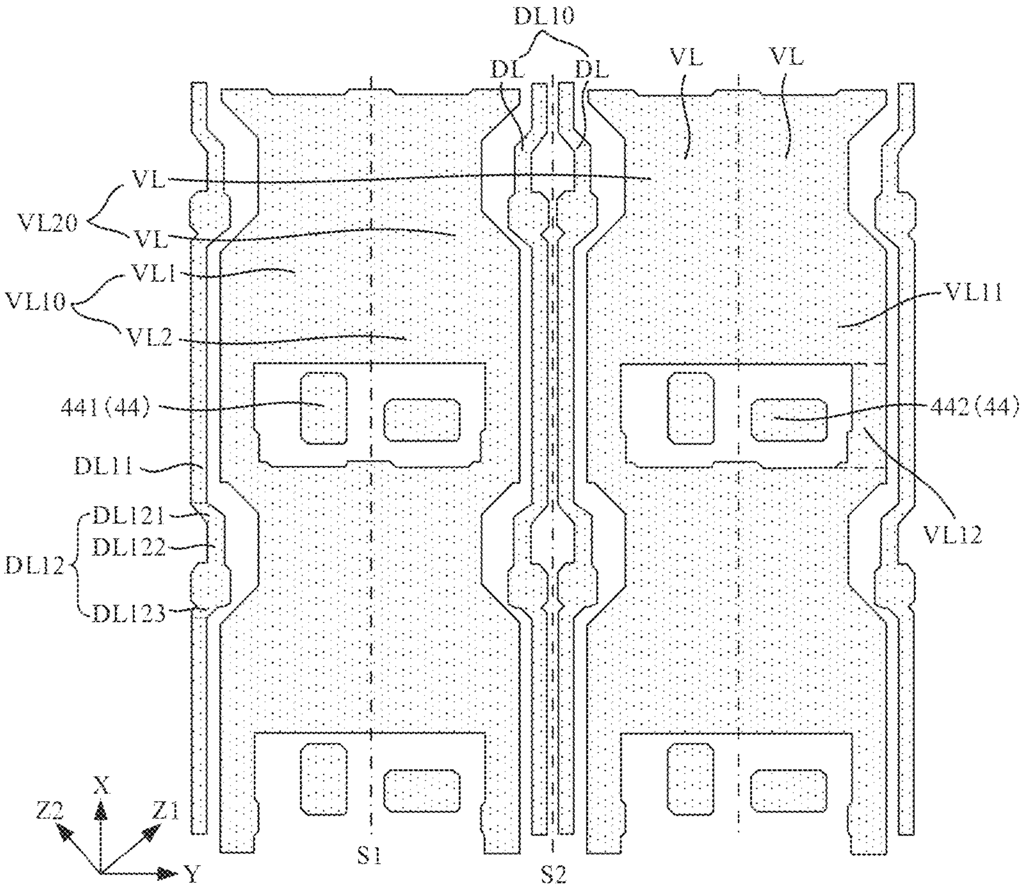
FIG. 13B is a structural diagram of another power supply signal line and a data line, in accordance with some embodiments.

In some other examples, as shown in FIGS. 9 and 13B, the two power supply signal lines VL of the first power supply signal line group VL10 are provided as one piece. Of the two power supply signal lines VL provided as one piece in the first power supply signal line group VL10, a portion located on a side of a first pixel circuit 410 away from the substrate 11 and is electrically connected to the first pixel circuit 410, and the other portion is located on a side of a second pixel circuit 420 away from the substrate 11 (referring to FIG. 3A) and is electrically connected to the second pixel circuit 420. With this arrangement, it is beneficial to increase the cross-sectional area of the power supply signal line VL and reduce the resistance.

On this basis, as shown in FIGS. 3A, 13A and 14A, the plurality of anodes 31 include first anodes 315. A first anode 315 includes a main body portion 310, and a center line of the main body portion 310 of the first anode 315 extending along the first direction X substantially coincides with the first axis S1. And an orthographic projection of the main body portion 310 of the first anode 315 on the substrate 11 overlaps with orthographic projections of the two power supply signal lines VL of the first power supply signal line group VL10 on the substrate 11.

In this case, for regions where the orthographic projection of the main body portion 310 of the first anode 315 on the substrate 11 overlaps with the orthographic projections of the power supply signal lines VL on the substrate 11, in the second direction Y, a maximum distance of each region from the first axis S1 is approximately the same, and a minimum distance of each region from the first axis S1 is approximately the same. In this way, heights of two sides of the main body portion 310 of the first anode 315 in the second direction Y may be balanced, and the flatness of the main body portion 310 of the first anode 315 may be improved.

Furthermore, with reference to FIGS. 3A, 9 and 14A, pixel circuits 40 below the main body portion 310 of the first anode 315 are symmetrical about the first axis S1, therefore, for regions where the orthographic projection of the main body portion 310 of the first anode 315 on the substrate 11 overlaps with orthographic projections of patterns (e.g., active layer patterns 41) included in the pixel circuits 40 on the substrate 11, in the second direction Y, a maximum distance of each region from the first axis S1 is approximately the same, and a minimum distance of each region from the first axis S1 is approximately the same. In this way, the heights of the two sides of the main body portion 310 of the first anode 315 in the second direction Y may be further balanced, and the flatness of the main body portion 310 of the first anode 315 may be improved.

It will be noted that in a case where the plurality of anodes 31 includes multiple red anodes 311, multiple blue anodes 312, multiple first green anodes 313 and multiple second green anodes 314, the above-mentioned first anodes 315 may include the red anodes 311 and the blue anodes 312.

For example, referring to FIGS. 14A, 14B and 15, the main body portion 310 of the first anode 315 is substantially in a shape of a rhombus, a fan, a circle or an ellipse. In a case where the main body portion 310 of the first anode 315 is substantially in a shape of a rhombus or a fan, a symmetry axis of the main body portion 310 of the first anode 315 is arranged along the first direction X or the second direction Y.

In this case, the regions where the orthographic projection of the main body portion 310 of the first anode 315 on the substrate 11 (referring to FIG. 3A) overlaps with the orthographic projections of the power supply signal lines VL on the substrate 11 (referring to FIG. 3A) are substantially figures of mirror symmetry with the first axis S1 as the symmetry axis. In this way, the heights of the two sides of the main body portion 310 of the first anode 315 in the second direction Y have a better consistency, and the flatness of the main body portion 310 of the first anode 315 is higher.

In some embodiments, as shown in FIGS. 3A and 14A, the orthographic projection of the main body portion 310 of the first anode 315 on the substrate 11 may be located between orthographic projections of two edges, away from each other, of the two power supply signal lines VL of the first power supply signal line group VL10 on the substrate 11.

With this arrangement, edges on opposite sides of the main body portion 310 of the first anode 315 in the second direction Y may each be supported by a power supply signal line VL, so that the heights of the two sides of the main body portion 310 of the first anode 315 in the second direction Y have a better consistency, and the flatness of the main body portion 310 of the first anode 315 is higher.

In some embodiments, as shown in FIG. 13A, the power supply signal line VL includes first trace segments VL11 and second trace segments VL12 alternately connected, in which along the second direction Y, a minimum width of a first trace segment VL11 is greater than a maximum width of a second trace segment VL12.

As shown in FIG. 13A, along the first direction X, a first trace segment VL11 is located between overlapping portions 44 of adjacent pixel circuits 40, and an orthographic projection of the first trace segment VL11 on the substrate 11 overlaps with an orthographic projection of the main body portion 310 of the first anode 315 on the substrate 11.

As shown in FIG. 13A, along the second direction Y, the first overlapping portion 441 and the second overlapping portion 442 in the same pixel circuit group 400 are located between second trace segments VL12 of the two power supply signal lines VL of the first power supply signal line group VL10.

In this case, the power supply signal line VL are staggered with overlapping portions 44, which is beneficial to the electrical connection between an anode 31 and an overlapping portion 44 of a pixel circuit 40.

In some embodiments, as shown in FIGS. 3A, 4 and 13A, the display panel 100 further includes a plurality of data lines DL extending in the first direction X. Each data line DL is connected to pixel circuits 40. For example, each data line DL is connected to data signal terminals DATA of the pixel circuits 40, and is configured to transmit a data signal Data to each of the data signal terminals DATA.

As shown in FIGS. 9, 10 and 13A, two data lines DL respectively connected to a first pixel circuit 410 and a second pixel circuit 420 that belong to different pixel circuit groups 400 and are adjacent form a first data line group DL10, and the two data lines DL of the first data line group DL10 are symmetrical about a second axis S2, where the second axis S2 extends along the first direction Y.

On this basis, as shown in FIGS. 3A, 13A and 14A, the plurality of anodes 31 include second anodes 316. A second anode 316 includes a main body portion 310, and a center line of the main body portion 310 of the second anode 316 extending along the first direction X substantially coincides with the second axis S2. And an orthographic projection of the main body portion 310 of the second anode 316 on the substrate 11 overlaps with orthographic projections of the two data lines DL of the first data line group DL10 on the substrate 11.

In this case, for regions where the orthographic projection of the main body portion 310 of the second anode 316 on the substrate 11 overlaps with the orthographic projections of the data lines DL on the substrate 11, in the second direction Y, a maximum distance of each region from the second axis S2 is approximately the same, and a minimum distance of each region from the second axis S2 is approximately the same. In this way, heights of two sides of the main body portion 310 of the second anode 316 in the second direction Y may be balanced, and the flatness of the main body portion 310 of the second anode 316 may be improved.

Furthermore, with reference to FIGS. 3A, 9 and 14A, pixel circuits 420 that belong to different pixel circuit groups 400 and are adjacent are further symmetrical about the second axis S2. In this case, pixel circuits 40 below the main body portion 310 of the second anode 316 are further symmetrical about the second axis S2. Therefore, for regions where the orthographic projection of the main body portion 310 of the second anode 316 on the substrate 11 overlaps with orthographic projections of patterns (e.g., active layer patterns 41) included in the pixel circuits 40 on the substrate 11, in the second direction Y, a maximum distance of each region from the second axis S2 is approximately the same, and a minimum distance of each region from the second axis S2 is approximately the same. In this way, the heights of the two sides of the main body portion 310 of the second anode 316 in the second direction Y may be further balanced, and the flatness of the main body portion 310 of the second anode 316 may be improved.

It will be noted that in a case where the plurality of anodes 31 includes multiple red anodes 311, multiple blue anodes 312, multiple first green anodes 313 and multiple second green anodes 314, the above-mentioned second anodes 316 may include the first green anodes 313 and the second green anodes 314.

For example, referring to FIGS. 14A, 14B, and 15, the main body portion 310 of the second anode 316 is substantially in a shape of a rectangle, where long sides of the rectangle are set along the first oblique direction Z1 or the second oblique direction Z2.

In this case, regions, where the orthographic projection of the main body portion 310 of the second anode 316 on the substrate 11 (referring to FIG. 3A) overlaps with the orthographic projections of the two data lines DL of the first data line group DL10 on the substrate 11 (referring to FIG. 3A), are substantially symmetrical about a geometric center of the main body portion 310 of the second anode 316. In this way, the heights of two sides of the main body portion 310 of the second anode 316 in the second direction Y have a better consistency, and the flatness of the main body portion 310 of the second anode 316 is higher.

In some embodiments, as shown in FIGS. 3A, 9, and 14A, two power supply signal lines VL respectively connected to a first pixel circuit 410 and a second pixel circuit 420 that belong to different pixel circuit groups 400 and are adjacent form a second power supply signal line group VL20, and the two power supply signal lines VL of the second power supply signal line group VL20 are symmetrical about the second axis S2.

In addition, the two data lines DL of the first data line group DL10 are located between the two power supply signal lines VL of the second power supply signal line group VL20. And the orthographic projection of the main body portion 310 of the second anode 316 on the substrate 11 further overlaps with orthographic projections of the two power supply signal lines VL of the second power supply signal line group VL20 on the substrate 11.

In this case, the power supply signal lines VL may further provide the effect of supporting the two sides of the main body portion 310 of the second anode 316 in the second direction Y and balancing the heights of the two sides of the main body portion 310 of the second anode 316 in the second direction Y, so that the heights of the two sides of the main body portion 310 of the second anode 316 in the second direction Y may be further balanced, and the flatness of the main body portion 310 of the second anode 316 is improved.

Furthermore, the orthographic projection of the main body portion 310 of the second anode 316 on the substrate 11 is located between orthographic projections of two edges, away from each other, of the two power supply signal lines VL of the second power supply signal line group VL20 on the substrate 11.

With this arrangement, edges on opposite sides of the main body portion 310 of the second anode 316 in the second direction Y may each be supported by a power supply signal line VL, so that the heights of the two sides of the main body portion 310 of the second anode 316 in the second direction Y have a better consistency, and the flatness of the main body portion 310 of the second anode 316 is higher.

In some embodiments, referring to FIG. 13A, the data line DL includes straight line segments DL11 and at least one bent segment DL12 alternately connected.

As shown in FIG. 13A, the straight line segments DL11 extend in the first direction X, and an orthographic projection of a straight line segment DL11 on the substrate 11 overlaps with the orthographic projection of the main body portion 310 of the second anode 316 on the substrate 11.

As shown in FIG. 13A, along the first direction X, a bent segment DL12 is located between main body portions 310 of two adjacent second anodes 316, and the bent segment DL12 is bent in a direction away from the second axis S2.

For example, as shown in FIG. 13A, a bent segment DL12 may include a first section DL121, a second section DL122 and a third section DL123 connected in sequence, in which the first section DL121 and the third section DL123 are respectively connected to straight line segments DL11 on both sides of the bent segment DL12, and the second section DL122 is farther from the second axis S2 than the straight line segments DL11.

That is, bent segments DL12 of the two data lines DL of the first data line group DL10 are bent in a direction away from each other to form an avoidance region. The avoidance region may be configured as a light-transparent region for light collection of functional devices on the non-light-exit side of the display panel 100.

For example, the display panel 100 further includes functional devices that need to collect external ambient light and are integrated on the non-light-exit side of the display panel 100. Here, the functional devices may include fingerprint recognition units, a photosensitive device and other functional components.

On this basis, referring to FIGS. 13A and 17, the pixel defining layer 13 is provided with a plurality of first openings 131, and a first opening 131 is located between the bent segments DL12 of the two data lines DL of the first data line group DL10. That is, the first opening 131 is located in the above-mentioned avoidance region, so that a functional device is capable of collecting external ambient light through the first opening 131, thereby preventing the data lines DL from interfering with the light collection of the functional device.

It should be understood that the power supply signal lines VL and the data lines DL may be provided to be in a same layer or located in different layers. The following is an exemplary description of the pixel circuits 40, the power supply signal lines VL, and the data lines DL mentioned above in terms of the power supply signal lines VL and the data lines DL being in different layers, and in conjunction with the film layer structure of the display panel 100.

As shown in FIGS. 6, 7, 8, 9, 10 and 11, along a direction perpendicular to and away from the substrate 11, the display panel 100 includes an active layer ACT, a first gate conductive layer GT1, a second gate conductive layer GT2, a first source-drain conductive layer SD1, a second source-drain conductive layer SD2, a first planarization layer 14 and an anode layer 15 arranged in sequence.

Here, active layer patterns 41 are located in the active layer ACT; gates 434 (control electrodes) of the thin film transistors 43 and first electrode plates of the storage capacitors C are located in the first gate conductive layer GT1; second electrode plates of the storage capacitors C are located in the second gate conductive layer GT2; and overlapping portions 44 may each be in a structure of stacked layers and are located in at least a part of the active layer ACT, the first gate conductive layer GT1, the second gate conductive layer GT2, the first source-drain conductive layer SD1, and the second source-drain conductive layer SD2.

It will be noted that among the active layer ACT, the first gate conductive layer GT1, the second gate conductive layer GT2, the first source-drain conductive layer SD1 and the second source-drain conductive layer SD2, every adjacent two layers is provided with an insulating film layer therebetween.

For example, referring to FIG. 3A, the display panel 100 further includes a first gate insulating layer G11, a second gate insulating layer G12, an interlayer insulating layer ILD and a second planarization layer 16.

Here, the first gate insulating layer G11 is provided between the active layer ACT and the first gate conductive layer GT1. The second gate insulating layer G12 is provided between the first gate conductive layer GT1 and the second gate conductive layer GT2. The interlayer insulating layer ILD is provided between the second gate conductive layer GT2 and the first source-drain conductive layer SD1. The second planarization layer 16 is provided between the first source-drain conductive layer SD1 and the second source-drain conductive layer SD2.

On this basis, referring to FIGS. 3A and 13A, the plurality of data lines DL may be located in the first source-drain conductive layer SD1; and/or the plurality of power supply signal lines VL may be located in the second source-drain conductive layer SD2.

In some embodiments, the display panel 100 further includes a third source-drain conductive layer, and the third source-drain conductive layer is located between the first source-drain conductive layer SD1 and the second source-drain conductive layer SD2.

On this basis, the plurality of data lines DL may be located in the first source-drain conductive layer SD1 and/or the third source-drain conductive layer; and/or the plurality of power supply signal lines VL may be located in the second source-drain conductive layer SD2.

Figure 3B:
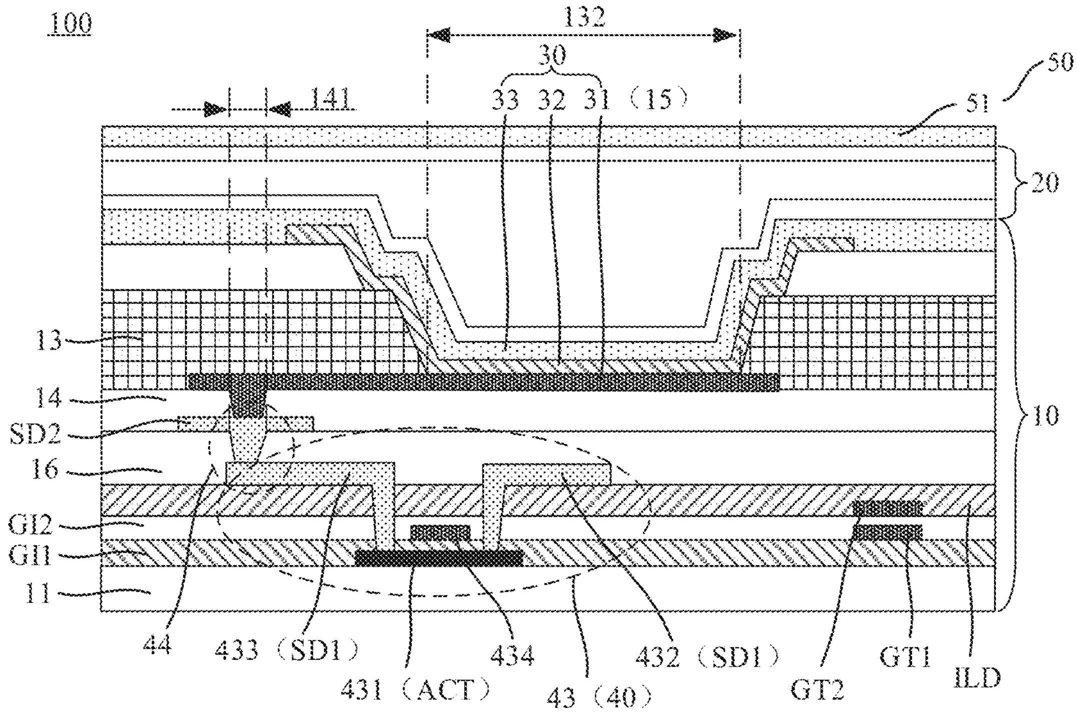
FIG. 3B is a cross-sectional view of another display panel, in accordance with some embodiments.

In some embodiments, as shown in FIGS. 3A and 3B, the display panel 100 may further include an anti-reflection film 50, and the anti-reflection film 50 is configured to reduce the reflection intensity of external ambient light on the display panel 100.

In some examples, referring to FIG. 3B, the anti-reflection film 50 includes a polarizer 51, and the polarizer 51 is provided on a side of the encapsulation layer 20 away from the substrate 11.

In some other examples, referring to FIG. 3A, the anti-reflection film 50 includes a black matrix 52 and a color filter 53. The black matrix 52 is used to separate the light emitted from different sub-pixels P, and has the function of reducing the reflected light generated after external ambient light enters the interior of the display panel 100. The color filter 53 can filter out most wavelength bands of the external ambient light, thereby reducing the reflection intensity of the external ambient light on the display panel 100.

Referring to FIGS. 3A and 17, the black matrix 52 is provided on a side of the pixel defining layer 13 away from the substrate 11. The black matrix 52 has a plurality of third openings 521, and a third opening 521 exposes at least part of a second opening 132.

Figure 18:
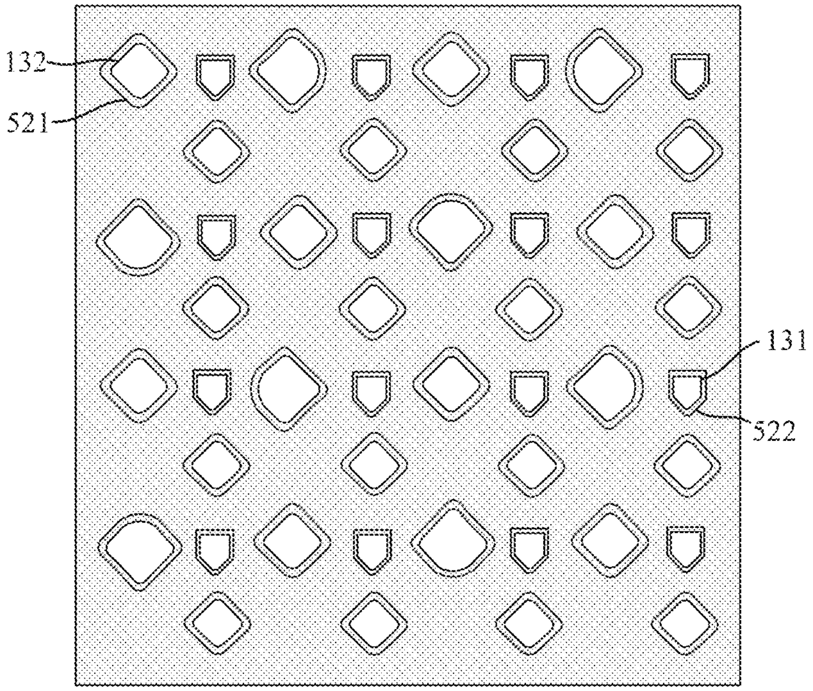
FIG. 18 is a top view of a stack of a pixel defining layer and a black matrix, in accordance with some embodiments.

Here, referring to FIGS. 3A, 17 and 18, the shape of an outer contour of the third opening 521 of the black matrix 52 may be the same as the shape of an outer contour of the second opening 132 of the pixel defining layer 13.

In addition, the size of the third opening 521 of the black matrix 52 may be greater than the size of the second opening 132 of the pixel defining layer 13, or may be smaller than the size of the second opening 132 of the pixel defining layer 13.

For example, as shown in FIGS. 3A and 18, the size of the third opening 521 of the black matrix 52 is larger than the size of the second opening 132 of the pixel defining layer 13; and a boundary an orthographic projection of the third opening 521 on the substrate 11 and a boundary of an orthographic projection of the second opening 132 on the substrate 11 have a distance therebetween, which ranges from 2 μm to 6 μm.

In a case where the display panel 100 further includes functional devices, the black matrix 52 further has a plurality of fourth openings 522, and a fourth opening 522 exposes at least part of a first opening 131.

Here, referring to FIGS. 3A, 17 and 18, the shape of an outer contour of the fourth opening 522 of the black matrix 52 may be the same as the shape of an outer contour of the first opening 131 of the pixel defining layer 13.

In addition, the size of the fourth opening 522 of the black matrix 52 may be larger than the size of the first opening 131 of the pixel defining layer 13, or may be smaller than the size of the first opening 131 of the pixel defining layer 13.

For example, as shown in FIGS. 3A and 18, the size of the fourth opening 522 of the black matrix 52 is larger than the size of the first opening 131 of the pixel defining layer 13; and a boundary an orthographic projection of the fourth opening 522 on the substrate 11 and a boundary of an orthographic projection of the first opening 131 on the substrate 11 have a distance therebetween, which ranges from 2 μm to 6 μm.

Referring to FIGS. 3A and 12, the color filter 53 is provided on a side of the pixel defining layer 13 away from the substrate 11. The color filter 53 includes a plurality of light filtering portions 530. Each light filtering portion 530 corresponds to a second opening 132 of the pixel defining layer 13. An orthographic projection of each light filtering portion 530 on the substrate 11 covers an orthographic projection of a corresponding second opening 132 on substrate 11. Moreover, each light filtering portion 530 is configured to transmit light of a single color.

It will to be noted that the material of the above-described light filtering portion 530 includes an organic material. For example, the material of the light filtering portion 530 includes polymethyl methacrylate, general-purpose polymers of polystyrene, polymer derivatives having phenol-like groups, acryloyl polymers, imide polymers, aryl ether polymers, amide polymers, fluorine polymers, paraxylene polymers, or vinyl alcohol polymers.

Referring to FIGS. 3A, 5, 11 and 12, the shape of an outer contour of the light filtering portion 530 may be substantially the same as the shape of an outer contour of the main body portion 310 of the anode 31.

Figure 19:
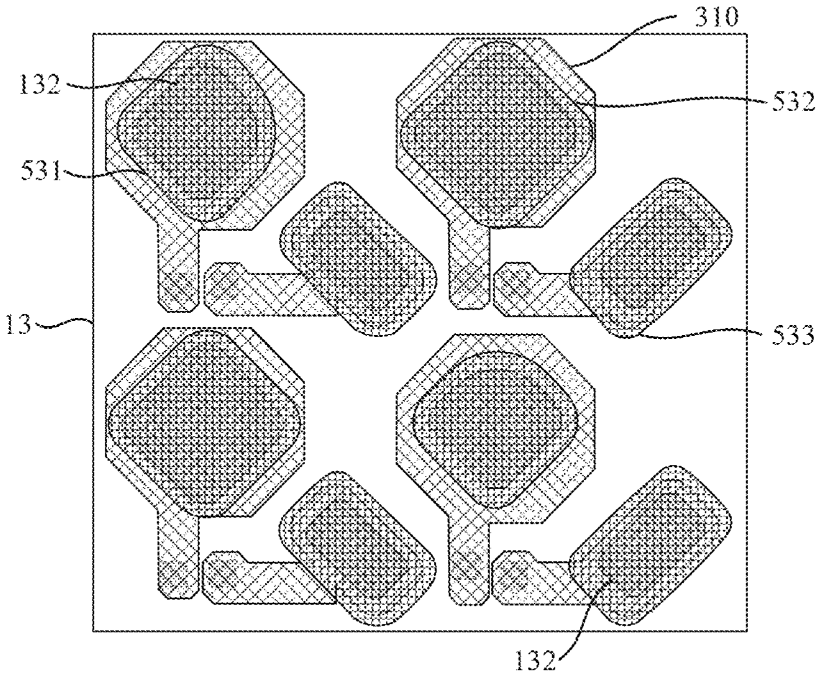
FIG. 19 is a top view of a stack of anodes, a pixel defining layer and a color filter, in accordance with some embodiments.

It will be noted that referring to FIGS. 3A and 19, in a case where the shape of the outer contour of the main body portion 310 of the anode 31 is different from the shape of the second opening 132 of the pixel defining layer 13, the shape of the outer contour of the light filtering portion 530 may also be set according to the shape of the second opening 132 of the pixel defining layer 13. That is, the shape of the outer contour of the light filtering portion 530 may be substantially the same as the shape of the second opening 132 of the pixel defining layer 13.

For example, as shown in FIG. 11, the plurality of anodes 31 include multiple red anodes 311, multiple blue anodes 312, multiple first green anodes 313 and multiple second green anodes 314.

In this case, referring to FIG. 12, the plurality of light filtering portions 530 may include red light filtering portions 531, blue light filtering portions 532, first green light filtering portions 533 and second green light filtering portions 534.

As shown in FIGS. 5, 11 and 12, a red light filtering portion 531 is provided on a side of a main body portion 310 of a red anode 311 away from the substrate 11, and is configured to transmit red light; a blue light filtering portion 532 is provided on a side of a main body portion 310 of a blue anode 312 away from the substrate 11 (referring to FIG. 3A), and is configured to transmit blue light; a first green light filtering portion 533 is provided on a side of a main body portion 310 of a first green anode 313 away from the substrate 11 (referring to FIG. 3A), and is configured to transmit green light; a second green light filtering portion 534 is provided on a side of a main body portion 310 of a second green anode 314 away from the substrate 11 (referring to FIG. 3A), and is configured to transmit green light.

Here, the shape of the red light filtering portion 531 may be substantially the same as the shape of the main body portion 310 of the red anode 311; the shape of the blue light filtering portion 532 may be substantially the same as the shape of the main body portion 310 of the blue anode 312; the shape of the first green light filtering portion 533 may be substantially the same as the shape of the main body portion 310 of the first green anode 313; and the shape of the second green light filtering portion 534 may be substantially the same as the shape of the main body portion 310 of the second green anode 314.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:

a substrate;

a plurality of pixel circuits, provided on the substrate, wherein the plurality of pixel circuits include multiple first pixel circuits and multiple second pixel circuits; the plurality of pixel circuits are arranged in multiple rows and multiple columns, and a row of pixel circuits is divided into multiple pixel circuit groups, a pixel circuit group includes a first pixel circuit and a second pixel circuit adjacent to each other; in a same pixel circuit group, a first pixel circuit is symmetrical with a second pixel circuit about a first axis, the first axis extends along a first direction, and the first direction is a column direction in which the plurality of pixel circuits are arranged; and a plurality of anodes, provided on a side of the plurality of pixel circuits away from the substrate;

wherein each pixel circuit includes an overlapping portion, and the pixel circuit is electrically connected to an anode through the overlapping portion; and an overlapping portion of the first pixel circuit is a first overlapping portion, and an overlapping portion of the second pixel circuit is a second overlapping portion; along a second direction, a minimum distance between the first overlapping portion and the second overlapping portion in the same pixel circuit group is a first distance, and the second direction is a row direction in which the plurality of pixel circuits are arranged; and along the second direction, a minimum distance between a first overlapping portion and a second overlapping portion that belong to different pixel circuit groups and are adjacent is a second distance, and the first distance is less than the second distance.

2. The display panel according to claim 1, further comprising:

a plurality of power supply signal lines, wherein each power supply signal line extends substantially along the first direction and is connected to pixel circuits; two power supply signal lines respectively connected to the two pixel circuits in the same pixel circuit group form a first power supply signal line group, and the two power supply signal lines of the first power supply signal line group are symmetrical about the first axis;

wherein the plurality of anodes include first anodes, a first anode includes a main body portion, and a center line of the main body portion of the first anode extending along the first direction substantially coincides with the first axis; and an orthographic projection of the main body portion of the first anode on the substrate overlaps with orthographic projections of the two power supply signal lines of the first power supply signal line group on the substrate.

3. The display panel according to claim 2, wherein the orthographic projection of the main body portion of the first anode on the substrate is located between orthographic projections of two edges, away from each other, of the two power supply signal lines of the first power supply signal line group on the substrate.

4. The display panel according to claim 2, wherein the power supply signal line includes first trace segments and second trace segments alternately connected, and along the second direction, a minimum width of a first trace segment is greater than a maximum width of a second trace segment; and along the first direction, the first trace segment is located between overlapping portions of adjacent pixel circuits, and an orthographic projection of the first trace segment on the substrate overlaps with the orthographic projection of the main body portion of the first anode on the substrate; and along the second direction, the first overlapping portion and the second overlapping portion in the same pixel circuit group are located between second trace segments of the two power supply signal lines of the first power supply signal line group.

5. The display panel according to claim 2, wherein the two power supply signal lines of the first power supply signal line group are provided separately from each other, and have a spacing therebetween; or the two power supply signal lines of the first power supply signal line group are provided as one piece.

6. The display panel according to claim 1, further comprising:

a plurality of data lines, wherein each data line extends substantially along the first direction and is connected to pixel circuits; and two data lines respectively connected to a first pixel circuit and a second pixel circuit that belong to different pixel circuit groups and are adjacent form a first data line group, the two data lines of the first data line group are symmetrical about a second axis, and the second axis extends along the first direction;

wherein the plurality of anodes include second anodes, a second anode includes a main body portion, and a center line of the main body portion of the second anode extending along the first direction substantially coincides with the second axis; and an orthographic projection of the main body portion of the second anode on the substrate overlaps with orthographic projections of the two data lines of the first data line group on the substrate.

7. The display panel according to claim 6, wherein along the first direction, a portion of the orthographic projection of the main body portion of the second anode on the substrate overlapping with each of the orthographic projections of the two data lines of the first data line group on the substrate has a substantially same length.

8. The display panel according to claim 6, further comprising:

a plurality of power supply signal lines, wherein two power supply signal lines respectively connected to the first pixel circuit and the second pixel circuit that belong to the different pixel circuit groups and are adjacent form a second power supply signal line group, and the two power supply signal lines of the second power supply signal line group are symmetrical about the second axis;

wherein the two data lines of the first data line group are located between the two power supply signal lines of the second power supply signal line group; and the orthographic projection of the main body portion of the second anode on the substrate further overlaps with orthographic projections of the two power supply signal lines of the second power supply signal line group on the substrate.

9. The display panel according to claim 8, wherein the orthographic projection of the main body portion of the second anode on the substrate is located between orthographic projections of two edges, away from each other, of the two power supply signal lines of the second power supply signal line group on the substrate.

10. The display panel according to claim 6, wherein the data line includes straight line segments and at least one bent segment alternately connected;

the straight line segments extend in the first direction, and an orthographic projection of a straight line segment on the substrate overlaps with the orthographic projection of the main body portion of the second anode on the substrate; and along the first direction, a bent segment is located between main body portions of two adjacent second anodes, and the bent segment is bent in a direction away from the second axis.

11. The display panel according to claim 10, wherein the bent segment includes a first section, a second section and a third section connected in sequence, the first section and the third section are respectively connected to straight line segments on both sides of the bent segment, and the second section is farther from the second axis than the straight line segments.

12. The display panel according to claim 10, further comprising:

a pixel defining layer, provided on a side of the plurality of anodes away from the substrate, wherein the pixel defining layer is provided with a plurality of first openings, and a first opening is located between bent segments of the two data lines of the first data line group.

13. The display panel according to claim 1, wherein along a direction perpendicular to the substrate and directed from the substrate to the plurality of anodes, the display panel comprises a first gate conductive layer, a second gate conductive layer, a first source-drain conductive layer and a second source-drain conductive layer arranged in sequence;

in a case where the display panel further comprises a plurality of power supply signal lines, the plurality of power supply signal lines are located in the second source-drain conductive layer;

in a case where the display panel further comprises a plurality of data lines, the plurality of data lines are located in the first source-drain conductive layer.

14. The display panel according to claim 1, wherein the pixel circuit includes an active layer pattern; for the first pixel circuit and the second pixel circuit located in the same pixel circuit group, a minimum distance between an active layer pattern of the first pixel circuit and an active layer pattern of the second pixel circuit is a third distance; for a first pixel circuit and a second pixel circuit that belong to different pixel circuit groups and are adjacent, a minimum distance between an active layer pattern of the first pixel circuit and an active layer pattern of the second pixel circuit is a fourth distance; and the third distance is less than the fourth distance.

15. The display panel according to claim 1, wherein the anodes each include a main body portion and a connecting portion, and the plurality of anodes include multiple red anodes, multiple blue anodes, multiple first green anodes and multiple second green anodes;

main body portions of the multiple red anodes and main body portions of the multiple blue anodes are alternately arranged in the first direction and the second direction, and a connecting portion of a red anode and a connecting portion of a blue anode are each electrically connected to a respective first pixel circuit;

main body portions of the multiple first green anodes and main body portions of the multiple second green anodes are alternately arranged in the first direction and the second direction, and a connecting portion of a first green anode and a connecting portion of a second green anode are each electrically connected to a respective second pixel circuit; and the main body portions of the multiple red anodes are alternately arranged with the main body portions of the multiple first green anodes in a first oblique direction, and are alternately arranged with the main body portions of the multiple second green anodes in a second oblique direction; and the main body portions of the multiple blue anodes are alternately arranged with the main body portions of the multiple first green anodes in the second oblique direction, and are alternately arranged with the main body portions of the multiple second green anodes in the first oblique direction;

wherein of the first oblique direction, the second oblique direction, the first direction and the second direction, any two intersect.

16. The display panel according to claim 15, wherein at least part of a main body portion of the red anode and at least part of a main body portion of the blue anode are each located between two first overlapping portions adjacent in the first direction, and the connecting portion of the red anode and the connecting portion of the blue anode extend substantially along the first direction;

and/or at least part of a main body portion of the first green anode and at least part of a main body portion of the second green anode are each located between a first overlapping portion and a second overlapping portion that belong to different pixel circuit groups and are adjacent, and the connecting portion of the first green anode and the connecting portion of the blue anode extend substantially along the second direction.

17. The display panel according to claim 15, further comprising:

a pixel defining layer, provided on a side of the plurality of anodes away from the substrate, wherein the pixel defining layer is provided with a plurality of second openings, and at least part region of each anode is exposed by a second opening; and a first planarization layer, in contact with surfaces of the plurality of anodes proximate to the substrate, wherein the first planarization layer is provided with overlapping holes, and the connecting portion of the anode is connected to the overlapping portion through an overlapping hole;

wherein a minimum distance between an orthographic projection of a boundary of the overlapping hole on the substrate and an orthographic projection of a boundary of the second opening on the substrate is greater than or equal to a first preset value.

18. The display panel according to claim 15, wherein the main body portion of the red anode, the main body portion of the blue anode, the main body portion of the first green anode, and the main body portion of the second green anode are each substantially in a shape of a circle or an ellipse; or of the main body portion of the red anode and the main body portion of the blue anode, one is substantially in a shape of a rhombus and the other is substantially in a shape of a fan; and the main body portion of the first green anode and the main body portion of the second green anode are each substantially in a shape of a rectangle; or an outer contour of one of the main body portion of the red anode and the main body portion of the blue anode includes a first curved edge and a second curved edge that are connected at ends, two connection points of the first curved edge and the second curved edge are a first connection point and a second connection point, a connection line between the first connection point and the second connection point is a first line segment, and the first curved edge and the first line segment form a semicircle, and the second curved edge and the first line segment form a semiellipse; the other of the main body portion of the red anode and the main body portion of the blue anode is substantially in a shape of a circle or an ellipse; and the main body portion of the first green anode and the main body portion of the second green anode are each substantially in a shape of a circle or an ellipse.

19. The display panel according to claim 15, wherein in a case where the plurality of anodes includes first anodes, the first anodes include the red anodes and the blue anodes; and in a case where the plurality of anodes includes second anodes, the second anodes include the first green anodes and the second green anodes.

20. A display apparatus, comprising the display panel according to claim 1.

* * * * *